(12) United States Patent
Lee et al.

(10) Patent No.: US 9,412,690 B2
(45) Date of Patent: Aug. 9, 2016

(54) PACKAGE SUBSTRATES, PACKAGES INCLUDING THE SAME, METHODS OF FABRICATING THE PACKAGES WITH THE PACKAGE SUBSTRATES, ELECTRONIC SYSTEMS INCLUDING THE PACKAGES, AND MEMORY CARDS INCLUDING THE PACKAGES

(71) Applicant: SK HYNIX INC., Icheon (KR)

(72) Inventors: Tae Ho Lee, Cheongju (KR); Il Hwan Cho, Icheon (KR); In Chul Hwang, Seoul (KR); Ga Hyun No, Cheongju (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/325,081

(22) Filed: Jul. 7, 2014

(65) Prior Publication Data
US 2015/0243596 A1 Aug. 27, 2015

(30) Foreign Application Priority Data
Feb. 25, 2014 (KR) .................. 10-2014-0021993

(51) Int. Cl.
*H01L 23/495* (2006.01)
*H01L 23/498* (2006.01)
*H01L 23/31* (2006.01)
*H01L 25/065* (2006.01)
*H01L 23/00* (2006.01)

(52) U.S. Cl.
CPC ....... *H01L 23/49838* (2013.01); *H01L 23/3107* (2013.01); *H01L 24/97* (2013.01); *H01L 25/0655* (2013.01); *H01L 23/49827* (2013.01); *H01L 2224/48091* (2013.01)

(58) Field of Classification Search
CPC ............... H01L 23/3107; H01L 24/97; H01L 23/49838; H01L 25/0655; H01L 2224/48091
USPC ........................................ 257/737, 676, 773
See application file for complete search history.

(56) References Cited

U.S. PATENT DOCUMENTS

2004/0058478 A1\* 3/2004 Islam ................ H01L 21/561
438/123

FOREIGN PATENT DOCUMENTS

KR 10-2011-0019321 A 2/2011
KR 10-2011-0047834 A 5/2011

\* cited by examiner

*Primary Examiner* — Thien F Tran

(57) ABSTRACT

A package substrate includes a substrate body and a plurality of patterns disposed on the substrate body. The substrate body has a first region including a chip attachment region and a second region adjacent to the first region. The plurality of patterns are disposed on the substrate body in the second region. Each of the plurality of patterns extends in a first direction to have a stripe shape, and the plurality of patterns are spaced apart from each other in a second direction which is substantially perpendicular to the first direction. Related fabrication methods, electronic systems and memory cards are also provided.

9 Claims, 25 Drawing Sheets

PACKAGE SUBSTRATES, PACKAGES INCLUDING THE SAME, METHODS OF FABRICATING THE PACKAGES WITH THE PACKAGE SUBSTRATES, ELECTRONIC SYSTEMS INCLUDING THE PACKAGES, AND MEMORY CARDS INCLUDING THE PACKAGES

CROSS-REFERENCE TO RELATED APPLICATION

The present application claims priority under 35 U.S.C. 119(a) to Korean Application No. 10-2014-0021993, filed on Feb. 25, 2014, in the Korean Intellectual Property Office, which is incorporated herein by reference in its entirety.

BACKGROUND

1. Technical Field

Embodiments of the present disclosure relate to semiconductor packages and, more particularly, to package substrates, packages including the same, methods of fabricating the packages, electronic systems including the packages, and memory cards including the packages.

2. Related Art

In the semiconductor industry, a packaging process may correspond to a final process for electrically connecting a semiconductor chip to a package substrate and for encapsulating the semiconductor chip with a molding material to protect the semiconductor chip from an external environment. Recently, semiconductor packaging techniques have become more important as high performance and smaller electronic systems are increasingly in demand with the rapid development of digital network communication systems. Recently, various types of packages have been developed in order to provide high density and/or mufti function, such as surface mount type packages, chip scale packages (CSPs), mufti-chip packages (MCPs), and system in packages (SiPs).

In semiconductor packaging, a molding process may be performed to encapsulate semiconductor chips with a molding material. The molding material protects the semiconductor chips from physical, electrical, or chemical shock. In addition, the molding material may have an excellent thermal conductivity to facilitate the dissipation of heat generated by the semiconductor chips.

SUMMARY

Various embodiments are directed to package substrates, packages including the same, methods of fabricating the packages, electronic systems including the packages, and memory cards including the packages.

According to some embodiments, a package substrate includes a substrate body and a plurality of patterns disposed on the substrate body. The substrate body has a first region including a chip attachment region and a second region adjacent to the first region. The plurality of patterns are disposed on the substrate body of the second region. Each of the plurality of patterns extends in a first direction and has a stripe shape, and the plurality of patterns are spaced apart from each other in a second direction which is substantially perpendicular to the first direction.

According to further embodiments, a package substrate includes a substrate body and a pattern disposed on the substrate body. The substrate body has a first region including a chip attachment region and a second region adjacent to the first region. The pattern is disposed on the substrate body in the second region. The pattern includes a first pattern portion being parallel with a side of the chip attachment region and has a stripe shape and a second pattern portion extending from an end of the first pattern toward the first region.

According to further embodiments, a package substrate includes a substrate body and a plurality of patterns disposed on the substrate body. The substrate body has a plurality of first regions arrayed in a first direction and a plurality of second regions between the plurality of first regions. Each of the plurality of first regions includes at least one chip attachment region. The plurality of patterns are disposed on the substrate body in the second regions. Each of the patterns is a stripe-shaped pattern which is parallel with the first direction.

According to further embodiments, a package substrate includes a substrate body and a plurality of patterns. The substrate body has a plurality of first regions arrayed in a first direction and a plurality of second regions interposed within the plurality of first regions. Each of the plurality of first regions includes at least one chip attachment region. The plurality of patterns are disposed on the substrate body in the second regions. Each of the patterns has a "V"-shaped configuration that inclines toward a second direction perpendicular to the first direction as it becomes closer to the chip attachment regions located at both sides thereof.

According to further embodiments, a package substrate includes a substrate body and a plurality of patterns. The substrate body has a plurality of first regions arrayed in a first direction and a plurality of second regions interposed within the plurality of first regions. Each of the plurality of first regions includes at least one chip attachment region. The plurality of patterns are disposed on the substrate body in the second regions. Each of the patterns includes a left pattern disposed on a left portion in each of the second regions and a right pattern disposed on a right portion in each of the second regions. Each of the left pattern and the right pattern includes a first pattern portion being parallel with a second direction perpendicular to the first direction and has a stripe shape and a second pattern portion extending from an end of the first pattern portion toward a closest the first region adjacent to the first pattern portion.

BRIEF DESCRIPTION OF THE DRAWINGS

Embodiments of the present disclosure will become more apparent in view of the attached drawings and accompanying detailed description, in which.

DESCRIPTION OF SPECIFIC EMBODIMENTS

A molding process used in fabrication of packages may be performed by putting a molding material heated to have a liquid state or a quasi-liquid state into a mold frame and pressurizing the molding material. While the molding material is pressurized, the molding material may be distributed into empty spaces in the mold frame to form a molding layer surrounding a semiconductor chip. When a transfer molding technique is employed in the molding process, the molding material having a liquid state or a quasi-liquid state may be supplied from a first end of the substrate toward a second end of the substrate opposite to the first end to fill the whole mold frame. While the molding material is injected into the mold frame, a flow speed of the molding material may vary according to a position of the molding material or a structure of the substrate and array of dice on the substrate. If the flow speed of the molding material is non-uniform in the mold frame, the mold frame may not be completely filled with the molding material, and voids may be formed in the molding layer. This phenomenon may occur when the molding process is performed to fabricate packages, such as flip chip packages, that have a narrow space between a package substrate and a semiconductor chip mounted on the package substrate.

Embodiments of the present disclosure provide a package substrate including patterns that are disposed on a substrate body of the package substrate. The patterns may be disposed between chip attachment regions on which semiconductor chips are mounted. The patterns may control a flow speed of the molding material supplied during the molding process to be uniform throughout the package substrate.

Moreover, in an embodiment wherein wires are formed to electrically connect the semiconductor chips to the package substrate, the patterns disposed between the semiconductor chips may reduce the flow speed of the molding material passing by the wires, and may therefore suppress wire sweep and/or prevent the wires from being damaged. Furthermore, the patterns disposed between the semiconductor chips may cause the molding material to be more readily introduced into a space between each semiconductor chip and the package substrate so as to sufficiently fill the space between each semiconductor chip and the package substrate.

Figure 1:
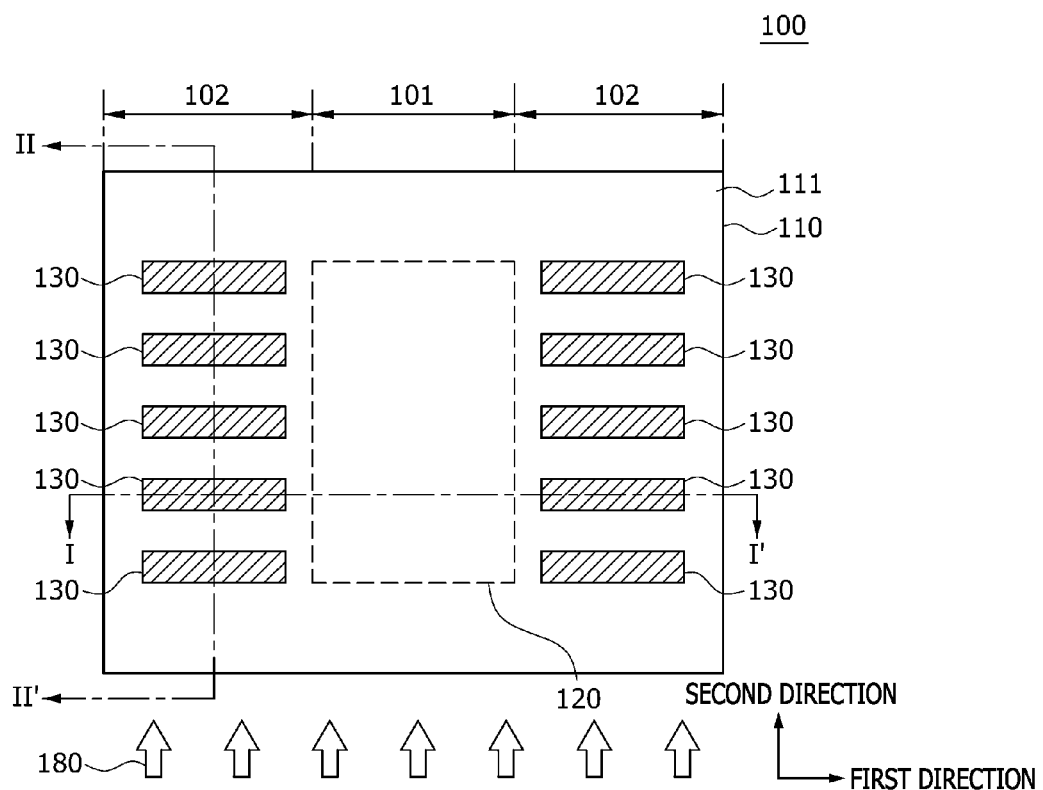
FIG. 1 is a plan view illustrating a package substrate according to an embodiment.
Figure 2:
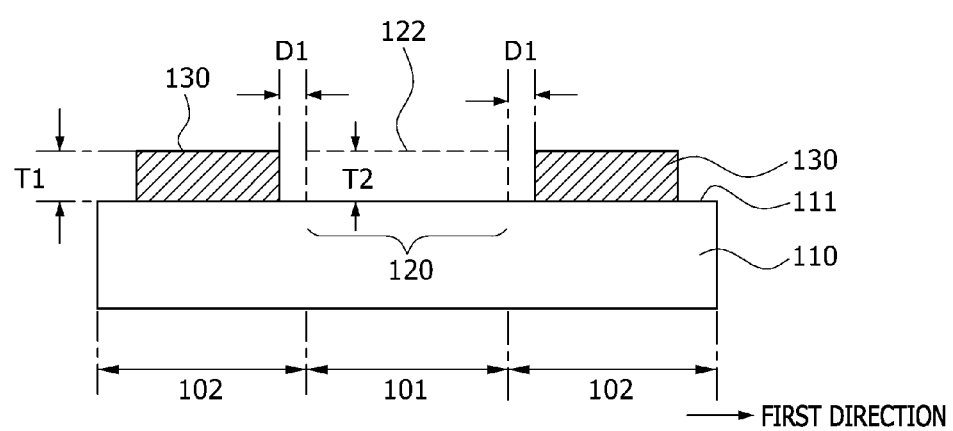
FIG. 2 is a cross-sectional view taken along a line I-I' of FIG. 1.
Figure 3:
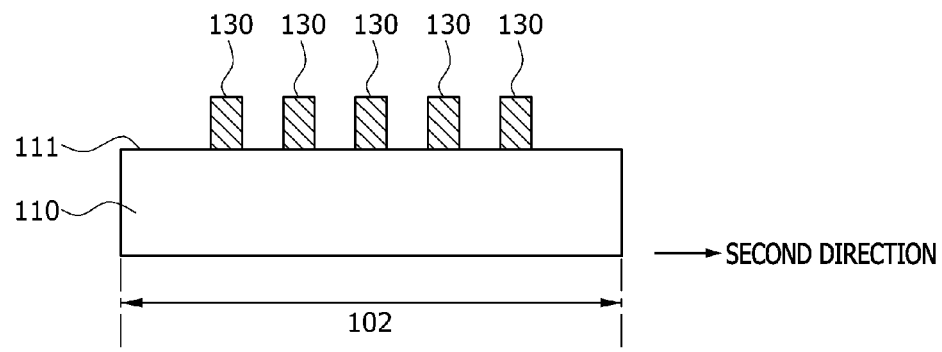
FIG. 3 is a cross-sectional view taken along a line II-II' of FIG. 1.

Referring to FIGS. 1, 2 and 3, a package substrate 100 according to an embodiment may include a substrate body 110. A top surface 111 of the substrate body 110 may have a chip attachment region 120 to which a semiconductor chip is attached. The substrate body 110 may have a first region 101 including the chip attachment region 120 and a pair of second regions 102 located at both sides of the first region 101. The first and second regions 101 and 102 may be arrayed in a first direction. That is, the pair of second regions 102 may be located at both edges of the substrate body 110 in the first direction respectively, and the first region 101 may be located between the pair of second regions 102. Each of substrate bodies of the embodiments described hereinafter may also include first and second regions having the same configuration as the first and second regions 101 and 102.

During a molding process for fabricating a package, a molding material may be injected in a direction denoted by arrows 180 to form a molding layer covering or surrounding the package substrate 100. The direction denoted by the arrows 180 may be parallel with a second direction crossing the first direction.

The package substrate 100 may further include a plurality of patterns 130 disposed on the top surface 111 of the substrate body 110 in the second regions 102. The patterns 130 may control a flow speed of the molding material introduced onto the top surface 111 of the substrate body 110 in the second regions 102. For example, the patterns 130 may reduce the flow speed of the molding material injected onto the top surface 111 of the substrate body 110 in the second regions 102. Each of the patterns 130 may have a stripe shape extending in the first direction, and the patterns 130 in each second region 102 may be disposed to be spaced apart from each other in the second direction.

The patterns 130 may be spaced apart from a semiconductor chip 122 to be mounted on the chip attachment region 120 by a distance D1, as shown in FIG. 2. In the present embodiment, all of the patterns 130 may be spaced apart from the semiconductor chip 122 by the distance D1. However, in some embodiments, distances between the patterns 130 and the semiconductor chip 122 may be different. In such an embodiment, lengths of the patterns 130 in the first direction may be different, or the patterns 130 may be arrayed in a zigzag or staggered fashion along the second direction when the patterns 130 have the same length.

If a height T1 (i.e., a vertical thickness) of the patterns 130 is greater than a thickness T2 of the semiconductor chip 122, a size of a package including the patterns 130 and the semiconductor chip 122 may increase and a flow speed of the molding material in the second regions 102 may be less than a flow speed of the molding material in the first region 101. Thus, in an embodiment, the height T1 of the patterns 130 may be equal to or less than the thickness T2 of the semiconductor chip 122. In some embodiments, the height T1 of the patterns 130 may be substantially equal to the thickness T2 of the semiconductor chip 122 to minimize a difference between the flow speed of the molding material in the second regions 102 and the flow speed of the molding material in the first region 101. In other embodiments, the height T1 of the patterns 130 may be less than the thickness T2 of the semiconductor chip 122. In some embodiments, each of the patterns 130 may include a solder resist material.

Figure 4:
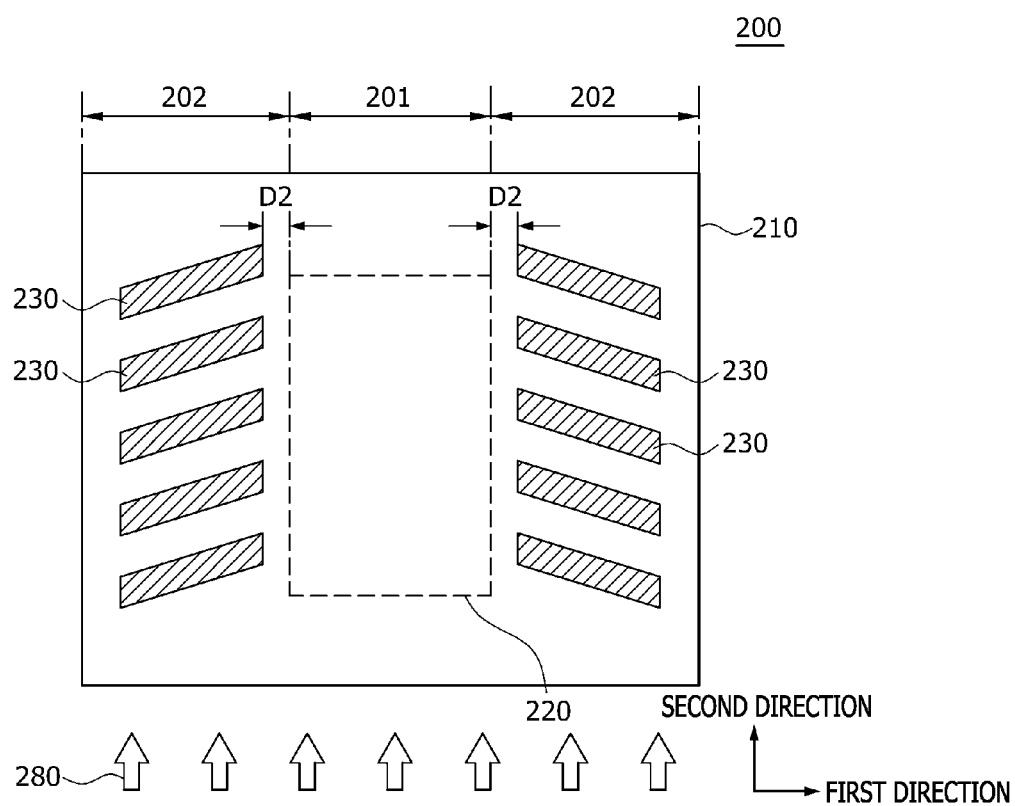
FIG. 4 is a plan view illustrating a package substrate according to another embodiment.

Referring to FIG. 4, a package substrate 200 according to another embodiment includes a substrate body 210 having a first region 201 and a pair of second regions 202 located at both sides of the first region 201. The first region 201 may include a chip attachment region 220 on which a semiconductor chip (not shown) is mounted. The first region 201 and the pair of second regions 202 may be arrayed in a first direction. The package substrate 200 may further include a plurality of patterns 230 disposed on a surface of the substrate body 210 in the second regions 202. That is, the patterns 230 may be disposed at both sides of the chip attachment region 220.

During a molding process for fabricating a package, a molding material may be injected in a direction denoted by arrows 280 to form a molding layer that covers or surrounds the package substrate 200 including the patterns 230. The direction denoted by the arrows 280 may be parallel with a second direction crossing the first direction.

The package substrate 200 may be included in a flip chip package including bumps or solder balls disposed between the package substrate 200 and the semiconductor chip to be mounted on the chip attachment region 220. The patterns 230 are disposed such that sufficient molding material is smoothly introduced into narrow spaces between the bumps or the solder balls under the semiconductor chip (i.e., the flip chip) during a molding process.

More specifically, as illustrated in FIG. 4, each of the patterns 230 may have a stripe shape which is non-parallel with both the first and second directions and may incline toward the second direction as it becomes closer to the chip attachment region 220. The patterns 230 in each second region 202 may be disposed to be spaced apart from each other in the second direction. Accordingly, a portion of the molding material injected onto the second regions 202 may be introduced into the chip attachment region 220 during the molding process.

The patterns 230 may be spaced apart from the semiconductor chip to be mounted on the chip attachment region 220 by a distance D2. In the present embodiment, all of the patterns 230 may be spaced apart from the semiconductor chip by the distance D2. However, in some embodiments, distances between the patterns 230 and the semiconductor chip may be different.

A height (i.e., a vertical thickness) of the patterns 230 may be equal to or less than a thickness of the semiconductor chip to be mounted on the chip attachment region 220. In some embodiments, the height of the patterns 230 may be substantially equal to the thickness of the semiconductor chip to be mounted on the chip attachment region 220. In other embodiments, the height of the patterns 230 may be less than the thickness of the semiconductor chip to be mounted on the chip attachment region 220. In some embodiments, each of the patterns 230 may include a solder resist material.

When a molding process is performed using a package substrate of the related arts in which structures corresponding to the patterns 230 are absent, a flow speed of the molding material in the second regions 202 may be different from a flow speed of the molding material in the first region 201 due to a level difference between a surface of the substrate body 210 in the second regions 202 and a top surface of the semiconductor chip mounted on the chip attachment region 220 in the first region 201. That is, the flow speed of the molding material in the second regions 202 may be higher than the flow speed of the molding material in the first region 201.

However, according to the present embodiment, the presence of the patterns 230 may reduce the flow speed of the molding material in the second regions 202 to a speed be substantially equal to the flow speed of the molding material in the first region 201. Thus, the flow speed of the molding material may be controlled to be uniform throughout the substrate body 210 by the patterns 230 disposed in the second regions 202. In addition, because each of the patterns 230 may be disposed to incline toward the second direction as it becomes closer to the chip attachment region 220, during the molding process sufficient molding material is smoothly introduced into a narrow space between the substrate body 210 and a flip chip mounted on the substrate body 210. Thus, the molding material may sufficiently fill spaces between bumps or solder balls attached to a bottom surface of the flip chip without forming voids between the spaces.

Figure 5:
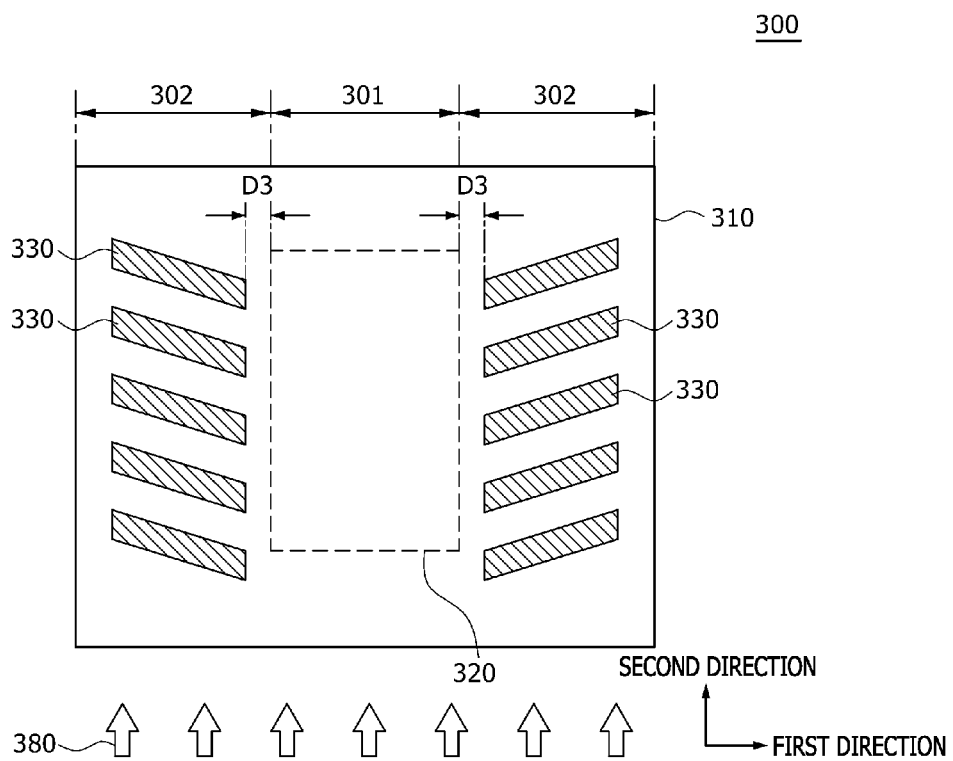
FIG. 5 is a plan view illustrating a package substrate according to another embodiment.

Referring to FIG. 5, a package substrate 300 according to another embodiment includes a substrate body 310 having a first region 301 and a pair of second regions 302 located at both sides of the first region 301. The first region 301 may include a chip attachment region 320 on which a semiconductor chip (not shown) is mounted. The first region 301 and the pair of second regions 302 may be arrayed in a first direction. The package substrate 300 may further include a plurality of patterns 330 disposed on a surface of the substrate body 310 in the second regions 302. That is, the patterns 330 may be disposed at both sides of the chip attachment region 320.

During a molding process for fabricating a package, a molding material may be injected in a direction denoted by arrows 380 to form a molding layer that covers or surrounds the package substrate 300 including the patterns 330. The direction denoted by the arrows 380 may be parallel with a second direction crossing the first direction.

The package substrate 300 may be included in a package including wires electrically connecting the package substrate 300 to the semiconductor chip to be mounted on the chip attachment region 320. During a molding process, the patterns 330 suppress the introduction of a portion of the molding material into a region where the wires are disposed. More specifically, as illustrated in FIG. 5, each of the patterns 330 may have a stripe shape which is non-parallel with both the first and second directions and may incline toward the second direction as it becomes farther from the chip attachment region 320. The patterns 330 in each second region 302 may be disposed to be spaced apart from each other in the second direction. Accordingly, a portion of the molding material injected onto the second regions 302 may be guided towards both edges of the substrate body 310 rather than onto both sides of the chip attachment region 320.

The patterns 330 may be spaced apart from a semiconductor chip (not shown) to be mounted on the chip attachment region 320 by a distance D3. In the present embodiment, all of the patterns 330 may be spaced apart from the semiconductor chip by the distance D3. However, in some embodiments, distances between the patterns 330 and the semiconductor chip may be different.

A height (i.e., a vertical thickness) of the patterns 330 may be equal to or less than a thickness of the semiconductor chip mounted on the chip attachment region 320. In some embodiments, the height of the patterns 330 may be substantially equal to the thickness of the semiconductor chip mounted on the chip attachment region 320. In other embodiments, the height of the patterns 330 may be less than the thickness of the semiconductor chip mounted on the chip attachment region 320. In some embodiments, each of the patterns 330 may include a solder resist material.

The patterns 330 may reduce a flow speed of the molding material in the second regions 302. That is, the presence of the patterns 330 may reduce the flow speed of the molding material in the second regions 302 to a speed substantially equal to the flow speed of the molding material in the first region 301. Thus, the patterns 330 disposed in the second regions 302 may control the flow speed of the molding material to be uniform throughout the substrate body 310. In addition, because each of the patterns 330 may be disposed to incline toward the second direction as it becomes farther from the chip attachment region 320, a flow speed of the molding material passing by the wires disposed between the chip attachment region 320 and the patterns 330 may be reduced to prevent the wires from being damaged or warped during the molding process.

Figure 6:
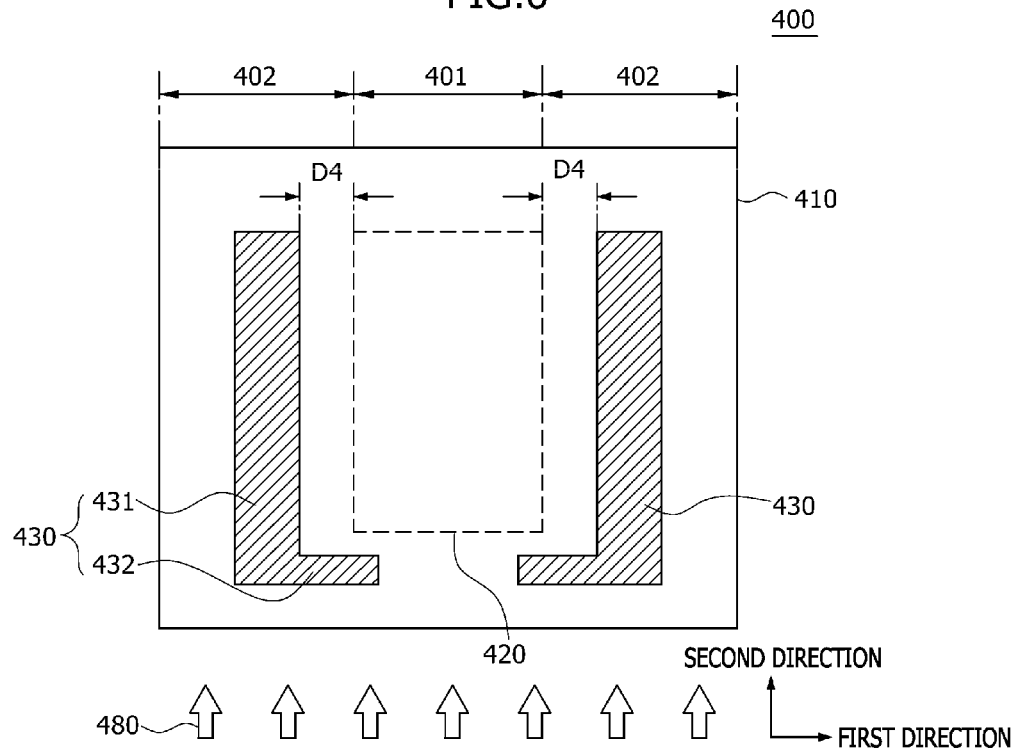
FIG. 6 is a plan view illustrating a package substrate according to another embodiment.

Referring to FIG. 6, a package substrate 400 according to another embodiment may include a substrate body 410 having a first region 401 and a pair of second regions 402 located at both sides of the first region 401. The first region 401 may include a chip attachment region 420 on which a semiconductor chip (not shown) is mounted. The first region 401 and the pair of second regions 402 may be arrayed in a first direction. The package substrate 400 may further include a pair of patterns 430 disposed on a surface of the substrate body 410 in the pair of second regions 402, respectively. That is, the pair of patterns 430 may be disposed at both sides of the chip attachment region 420, respectively.

During a molding process for fabricating a package, a molding material may be injected in a direction denoted by arrows 480 to form a molding layer that covers or surrounds the package substrate 400 including the patterns 430. The direction denoted by the arrows 480 may be parallel with a second direction crossing the first direction.

The package substrate 400 may be included in a package including wires electrically connecting the package substrate 400 to the semiconductor chip mounted on the chip attachment region 420, similarly to the package substrate 300 described with reference to FIG. 5. The patterns 430 are disposed to suppress, during a molding process, the introduction of a portion of the molding material into a region where the wires are disposed.

Each of the patterns 430 may include a first pattern portion 431 extending in the second direction and having a stripe shape and a second pattern portion 432 extending from an end of the first pattern portion 431 toward the first region 401 along the first direction. The first pattern portions 431 may be spaced apart from the chip attachment region 420 by a distance D4 and may be parallel with the second direction. The second pattern portions 432 may extend from ends of the first pattern portions 431 adjacent to an inlet of the molding material toward the first region 401 including the chip attachment region 420 in the first direction.

The second pattern portions 432 may be disposed to be adjacent to the inlet of the molding material to reduce an amount of the molding material introduced in wire regions between the chip attachment region 420 and the first pattern portions 431. A length of each second pattern portion 432 in the first direction may be greater than the distance D4. In an embodiment, the second pattern portion 432 may extend into the first region 401. In another embodiment, the length of each second pattern portion 432 in the first direction may be equal to or less than the distance D4.

As a result of the presence of the second patterns 432, a first amount of the molding material introduced in the wire regions between the chip attachment region 420 and the first patterns 431 may be less than a second amount of the molding material introduced in both edges of the substrate body 410.

A height (i.e., a vertical thickness) of the patterns 430 may be equal to or less than a thickness of the semiconductor chip mounted on the chip attachment region 420. In some embodiments, the height of the patterns 430 may be substantially equal to the thickness of the semiconductor chip mounted on the chip attachment region 420. In other embodiments, the height of the patterns 430 may be less than the thickness of the semiconductor chip mounted on the chip attachment region 420. In some embodiments, each of the patterns 430 may include a solder resist material.

According to the present embodiment, the patterns 430 may reduce a flow speed of the molding material in the second regions 402. That is, the presence of the patterns 430 may reduce the flow speed of the molding material in the second regions 402 to a speed substantially equal to the flow speed of the molding material in the first region 401. Thus, the patterns 430 disposed in the second regions 402 may control the flow speed of the molding material to be uniform throughout the substrate body 410. In addition, the patterns 430 may reduce an amount (or a flow speed) of the molding material introduced in the wire regions between the chip attachment region 420 and the first patterns 431 to prevent the wires from being damaged or warped during the molding process.

Figure 7:
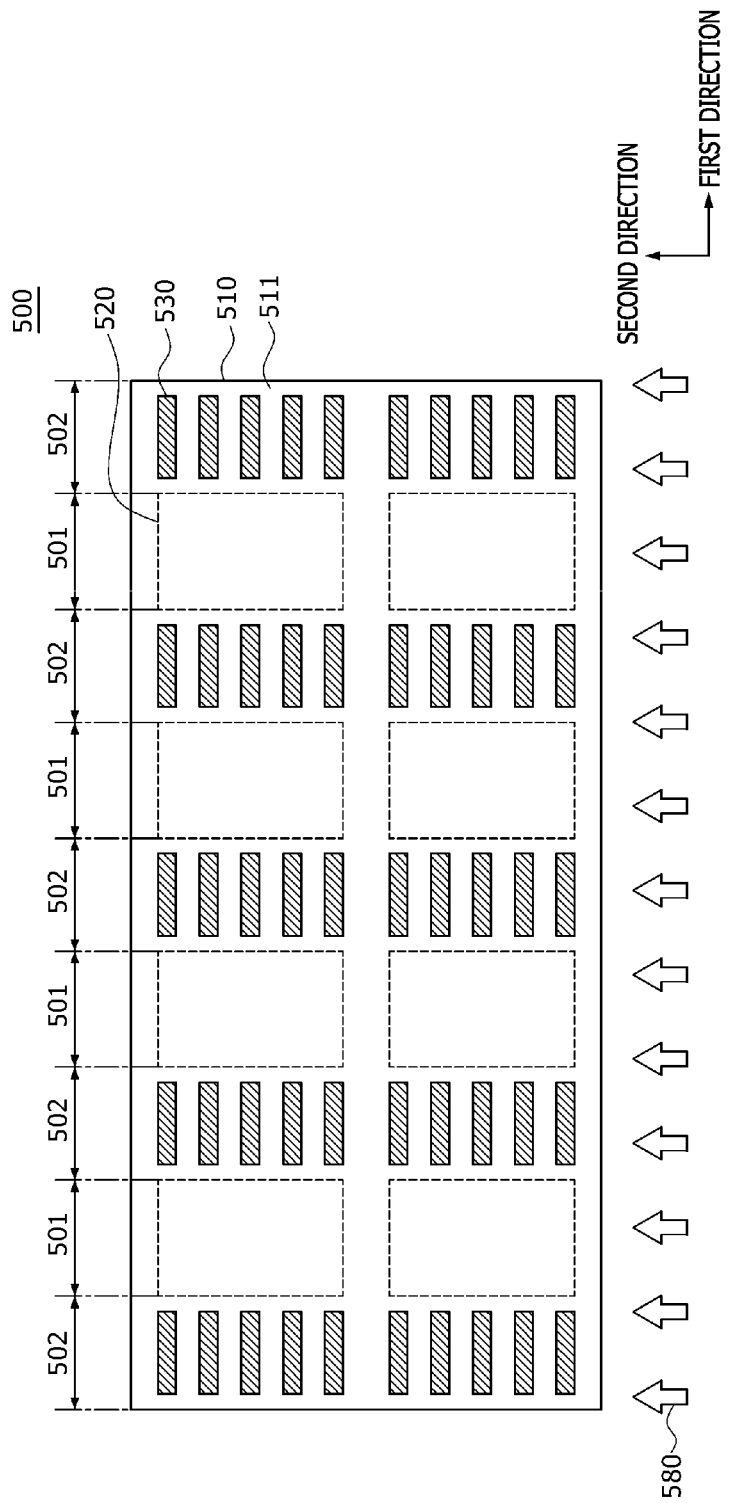
FIG. 7 is a plan view illustrating a package substrate according to another embodiment.

Referring to FIG. 7, a package substrate 500 according to another embodiment may include a substrate body 510 having a plurality of chip attachment regions 520 defined on a top surface 511 of the substrate body 510. The plurality of chip attachment regions 520 may be two dimensionally arrayed in even rows parallel with a first direction and in even columns parallel with a second direction. That is, the plurality of chip attachment regions 520 may be arrayed in a matrix form.

During a molding process for fabricating a package, a molding material may be injected in a direction denoted by arrows 580 to form a molding layer that covers or surrounds the package substrate 500. The direction denoted by the arrows 580 may be parallel with the second direction crossing the first direction.

The even columns in which the chip attachment regions 520 are arrayed may correspond to first regions 501, and odd columns between the first regions 501 may correspond to second regions 502. Thus, the first regions 501 and the second regions 502 may be alternately arrayed in the first direction.

Although FIG. 7 illustrates the chip attachment regions 520 having a rectangular shape, embodiments are not limited thereto. In an embodiment, the shape of the chip attachment regions 520 may depend on a shape of semiconductor chips which are attached to the substrate body 510.

A plurality of patterns 530 may be disposed on the top surface 511 of the substrate body 510 in the second regions 502. The patterns 530 may be disposed to control a flow speed of the molding material in the second regions 502. That is, the patterns 530 may be disposed to reduce the flow speed of the molding material in the second regions 502. Each of the patterns 530 may have a stripe shape extending in the first direction, and the patterns 130 in each second region 502 may be disposed to be spaced apart from each other in the second direction.

The patterns 530 may have a height (i.e., a thickness in a direction perpendicular to both the first and second directions) which is equal to or less than a thickness of the semiconductor chips to be attached to the chip attachment regions 520. In some embodiments, the height of the patterns 530 may be substantially equal to the thickness of the semiconductor chips to minimize a difference between the flow speed of the molding material in the second regions 502 and the flow speed of the molding material in the first regions 501. In other embodiments, the height of the patterns 530 may be less than the thickness of the semiconductor chips. In some embodiments, each of the patterns 530 may include a solder resist material.

Figure 8:
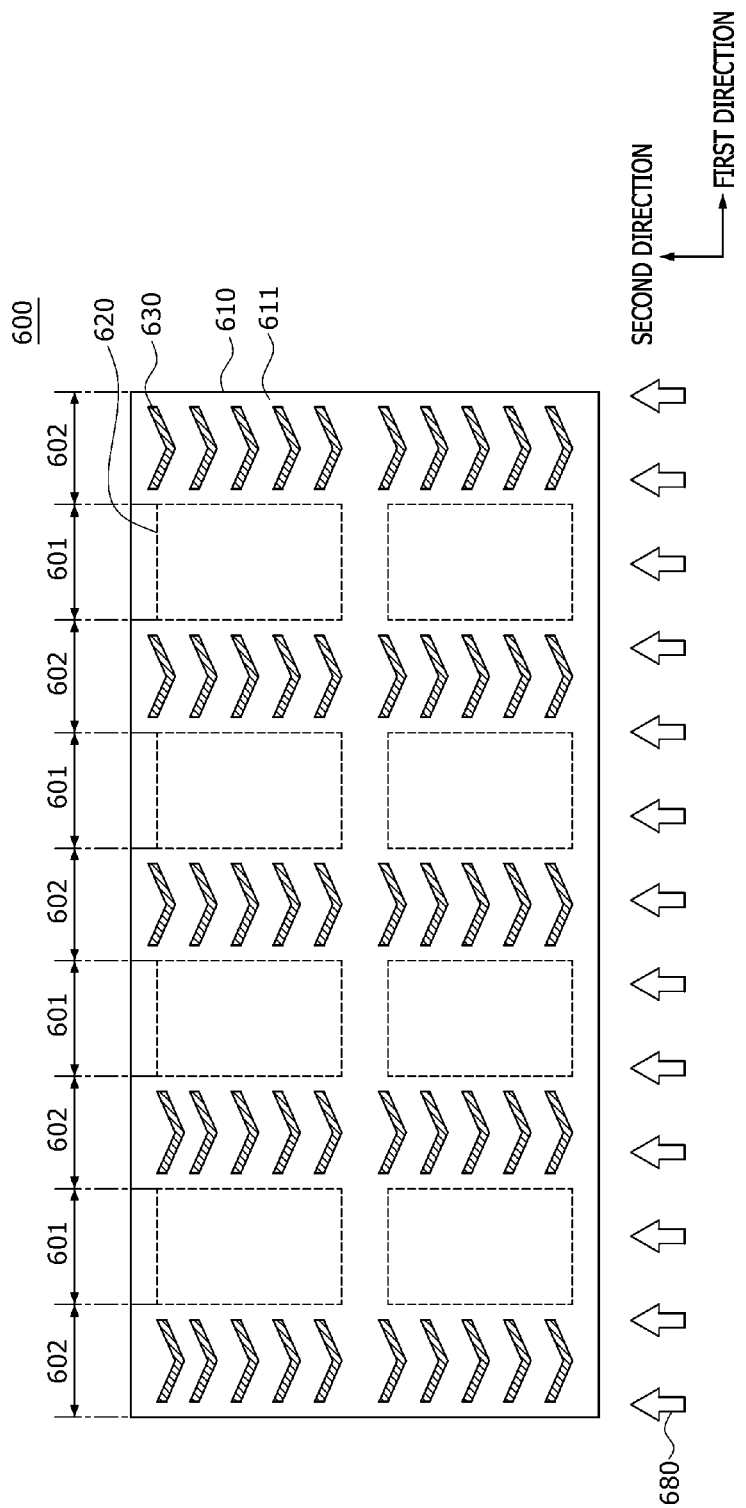
FIG. 8 is a plan view illustrating a package substrate according to another embodiment.

Referring to FIG. 8, a package substrate 600 according to another embodiment may include a substrate body 610 having a plurality of chip attachment regions 620 defined on a top surface 611 of the substrate body 610. The plurality of chip attachment regions 620 may be two dimensionally arrayed in even rows parallel with a first direction and in even columns parallel with a second direction. That is, the plurality of chip attachment regions 620 may be arrayed in a matrix form.

During a molding process for fabricating a package, a molding material may be injected in a direction denoted by arrows 680 to form a molding layer that covers or surrounds the package substrate 600. The direction denoted by the arrows 680 may be parallel with the second direction crossing the first direction.

The even columns in which the chip attachment regions 620 are arrayed may correspond to first regions 601, and odd columns between the first regions 601 may correspond to second regions 602. Thus, the first regions 601 and the second regions 602 may be alternately arrayed in the first direction.

Although FIG. 8 illustrates the chip attachment regions 620 having a rectangular shape, embodiments are not limited thereto. In an embodiment, the shape of the chip attachment regions 620 may depend on a shape of semiconductor chips to be attached to the substrate body 610.

A plurality of patterns 630 may be disposed on the top surface 611 of the substrate body 610 in the second regions 602. Each of the patterns 630 may have a "V"-shaped configuration that inclines toward the second direction as it becomes closer to the chip attachment regions 620 located at both sides thereof. The patterns 630 in each second region 602 may be spaced apart from each other by a predetermined distance in the second direction.

The patterns 630 may have a height (i.e., a thickness in a direction perpendicular to both the first and second directions) which is equal to or less than a thickness of the semiconductor chips to be attached to the chip attachment regions 620. In some embodiments, the height of the patterns 630 may be substantially equal to the thickness of the semiconductor chips to minimize a difference between the flow speed of the molding material in the second regions 602 and the flow speed of the molding material in the first regions 601. In other embodiments, the height of the patterns 630 may be less than the thickness of the semiconductor chips.

In particular, the "V"-shaped patterns 630 may lead or guide portions of the molding material injected into the second regions 602 towards the first regions 601 during a molding process. That is, during the molding process, the presence of the "V"-shaped patterns 630 may cause a sufficient amount of the molding material to be smoothly introduced into the first regions 601. Accordingly, in an embodiment wherein flip chips are mounted on the chip attachment regions 620, sufficient molding material is smoothly introduced into narrow spaces between bumps or solder balls disposed under the flip chip to contact the substrate body 610. In some embodiments, each of the patterns 630 may include a solder resist material.

Figure 9:
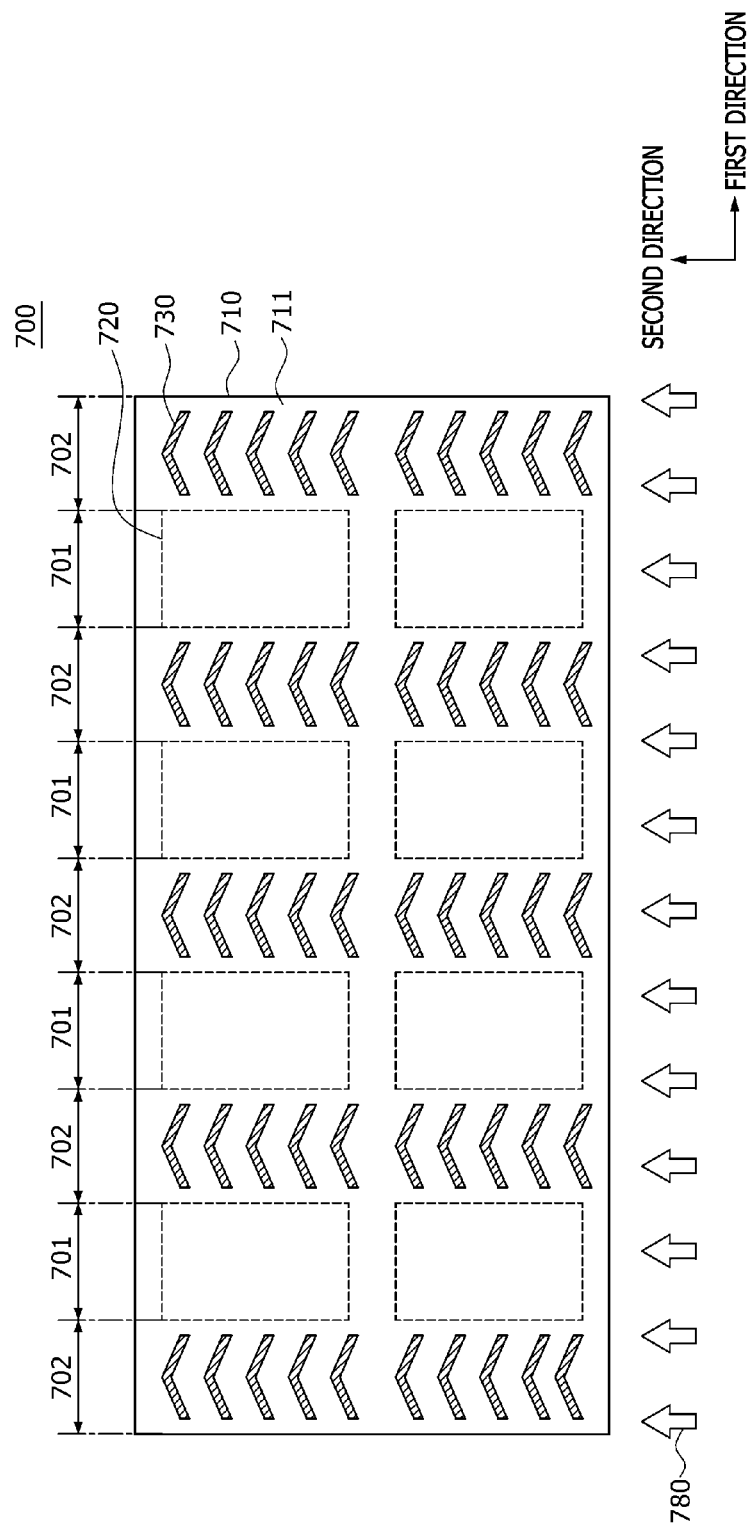
FIG. 9 is a plan view illustrating a package substrate according to another embodiment.

Referring to FIG. 9, a package substrate 700 according to another embodiment may include a substrate body 710 having a plurality of chip attachment regions 720 defined on a top surface 711 of the substrate body 710. The plurality of chip attachment regions 720 may be two dimensionally arrayed in even rows parallel with a first direction and in even columns parallel with a second direction. That is, the plurality of chip attachment regions 720 may be arrayed in a matrix form.

During a molding process for fabricating a package, a molding material may be injected in a direction denoted by arrows 780 to form a molding layer that covers or surrounds the package substrate 700. The direction denoted by the arrows 780 may be parallel with the second direction crossing the first direction.

The even columns in which the chip attachment regions 720 are arrayed may correspond to first regions 701, and odd columns between the first regions 701 may correspond to second regions 702. Thus, the first regions 701 and the second regions 702 may be alternately arrayed in the first direction.

Although FIG. 9 illustrates the chip attachment regions 720 having a rectangular shape, embodiments are not limited thereto. In an embodiment, the shape of the chip attachment regions 720 may depend on a shape of semiconductor chips to be attached to the substrate body 710.

A plurality of patterns 730 may be disposed on the top surface 711 of the substrate body 710 in the second regions 702. Each of the patterns 730 may have a "reversed V"-shaped configuration that inclines toward an antiparallel direction of the second direction as it becomes closer to the chip attachment regions 720 located at both sides thereof. The patterns 730 in each second region 702 may be spaced apart from each other by a predetermined distance in the second direction.

The patterns 730 may have a height (i.e., a thickness in a direction perpendicular to both the first and second directions) which is equal to or less than a thickness of the semiconductor chips to be attached to the chip attachment regions 720. In some embodiments, the height of the patterns 730 may be substantially equal to the thickness of the semiconductor chips to minimize a difference between the flow speed of the molding material in the second regions 702 and the flow speed of the molding material in the first regions 701. In other embodiments, the height of the patterns 730 may be less than the thickness of the semiconductor chips. Each of the patterns 730 may include a solder resist material.

In particular, the "reversed V"-shaped patterns 730 may reduce the flow speed of the molding material introduced in regions between the chip attachment regions 720 and the patterns 730. Thus, in an embodiment wherein the semiconductor chips attached to the chip attachment regions 720 are electrically connected to the substrate body 310 through wires formed in the regions between the chip attachment regions 720 and the patterns 730, the patterns 730 may prevent the wires from being damaged or warped during the molding process.

Figure 10:
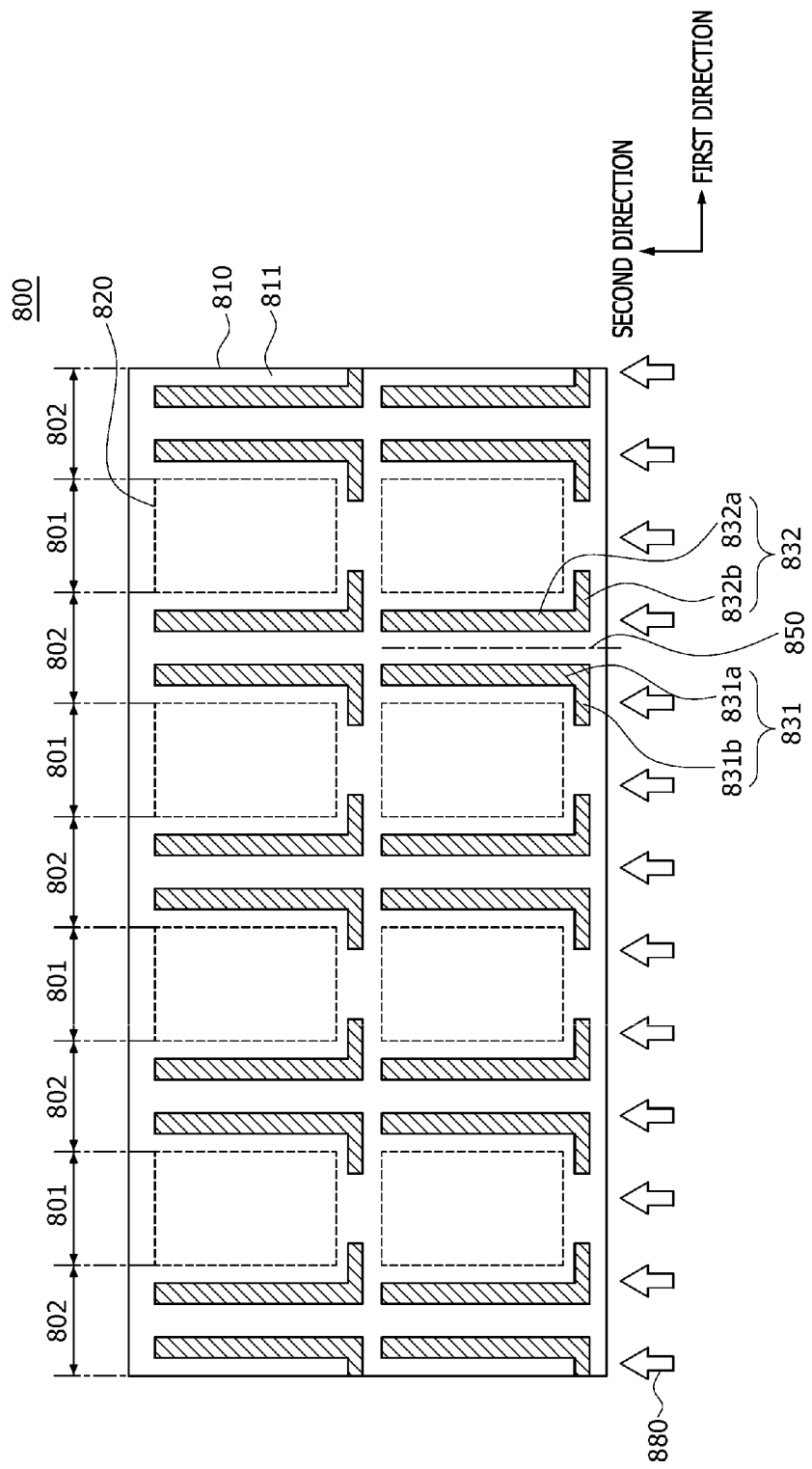
FIG. 10 is a plan view illustrating a package substrate according to another embodiment.

Referring to FIG. 10, a package substrate 800 according to another embodiment may include a substrate body 810 having a plurality of chip attachment regions 820 defined on a top surface 811 of the substrate body 810. The plurality of chip attachment regions 820 may be two dimensionally arrayed in even rows parallel with a first direction and in even columns parallel with a second direction. That is, the plurality of chip attachment regions 820 may be arrayed in a matrix form.

During a molding process for fabricating a package, a molding material may be injected in a direction denoted by arrows 880 to form a molding layer that covers or surrounds the package substrate 800. The direction denoted by the arrows 880 may be parallel with the second direction crossing the first direction.

The even columns in which the chip attachment regions 820 are arrayed may correspond to first regions 801, and odd columns between the first regions 801 may correspond to second regions 802. Thus, the first regions 801 and the second regions 802 may be alternately arrayed in the first direction.

Although FIG. 10 illustrates the chip attachment regions 820 having a rectangular shape, embodiments are not limited thereto. In an embodiment, the shape of the chip attachment regions 820 may depend on a shape of semiconductor chips to be attached to the substrate body 810.

Left patterns 831 and right patterns 832 may be disposed on a top surface 811 of the substrate body 810 in each of the second regions 802. Each of the left patterns 831 may include a first pattern portion 831a and a second pattern portion 831b. The first pattern portion 831a may be spaced apart from a right edge of the chip attachment region 820 by a predetermined distance and may extend in the second direction to have a stripe shape. The second pattern portion 831b may extends from an end of the first pattern portion 831a adjacent to an inlet of the molding material toward the first region 801 adjacent to the first pattern portion 831a along an antiparallel direction of the first direction. In an embodiment, a portion of the second pattern 831b may extend into the first region 801.

Each of the right patterns 832 may include a first pattern portion 832a and a second pattern portion 832b. The first pattern portion 832a may be spaced apart from a left edge of the chip attachment region 820 by a predetermined distance and may extend in the second direction to have a stripe shape. The second pattern portion 832b may extends from an end of the first pattern portion 832a adjacent to the inlet of the molding material toward the first region 801 adjacent to the first pattern portion 832a along the first direction. In an embodiment, a portion of the second pattern portion 832b may extend into the first region 801.

As a result, one of the left patterns 831 and one of the right patterns 832 may be disposed between a pair of the chip attachment regions 820 adjacent to each other in the first direction. The left pattern 831 and the right pattern 832 adjacent to each other in the first direction in each second region 802 may be disposed to be symmetric with respect to a central axis 850 of the second region 802 parallel with the second direction.

A height (i.e., a thickness in a direction perpendicular to both the first and second directions) of the left patterns 831 and the right patterns 832 may be equal to or less than a thickness of the semiconductor chips to be mounted on the chip attachment regions 820. In some embodiments, the height of the left patterns 831 and the right patterns 832 may be substantially equal to the thickness of the semiconductor chips mounted on the chip attachment regions 820. In other embodiments, the height of the left patterns 831 and the right patterns 832 may be less than the thickness of the semiconductor chips to be mounted on the chip attachment regions 820.

During a molding process, the left patterns 831 and the right patterns 832 may reduce a flow speed of the molding material introduced into the second regions 802. That is, the presence of the left patterns 831 and the right patterns 832 may control the flow speed of the molding material in the second regions 802 to be similar to the flow speed of the molding material in the first regions 801 including the semiconductor chips attached to the chip attachment regions 820.

In an embodiment wherein the semiconductor chips attached to the chip attachment regions 820 are electrically connected to the substrate body 810 through wires formed in wire regions between the chip attachment regions 820 and the left and right patterns 831 and 832, the second pattern portions 831b and 832b may reduce an amount (or a flow speed) of the molding material introduced in the wire regions to prevent the wires from being damaged or warped during the molding process. In some embodiments, each of the left and right patterns 831 and 832 may include a solder resist material.

Figure 11:
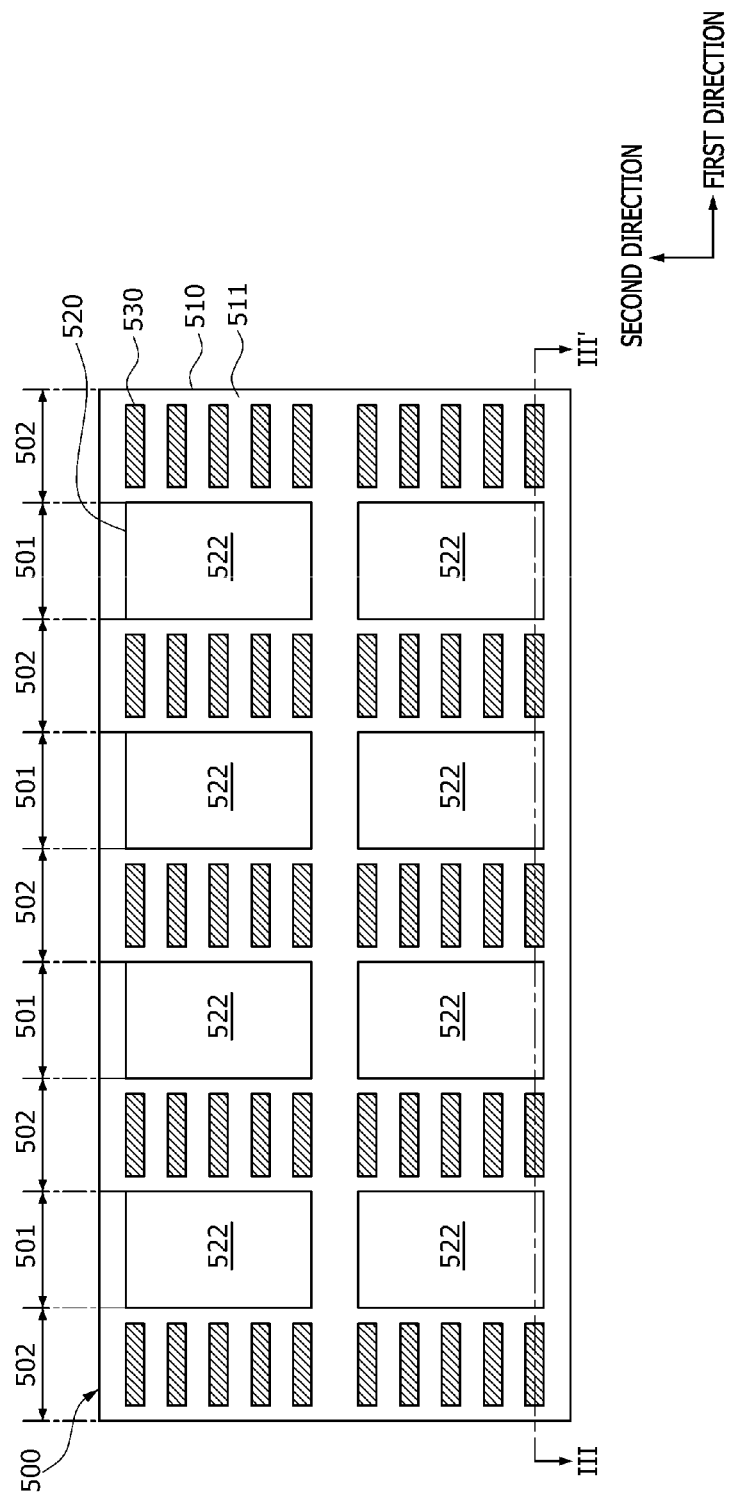
FIGS. 11, 12, and 13 are schematic views illustrating a process of fabricating packages using a package substrate according to an embodiment.
Figure 12:
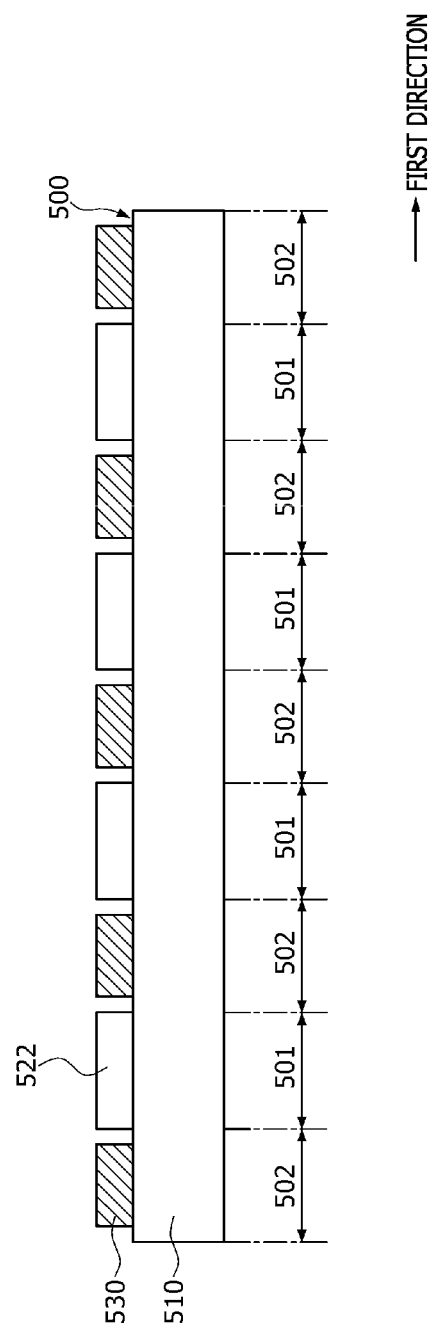
Figure 13:
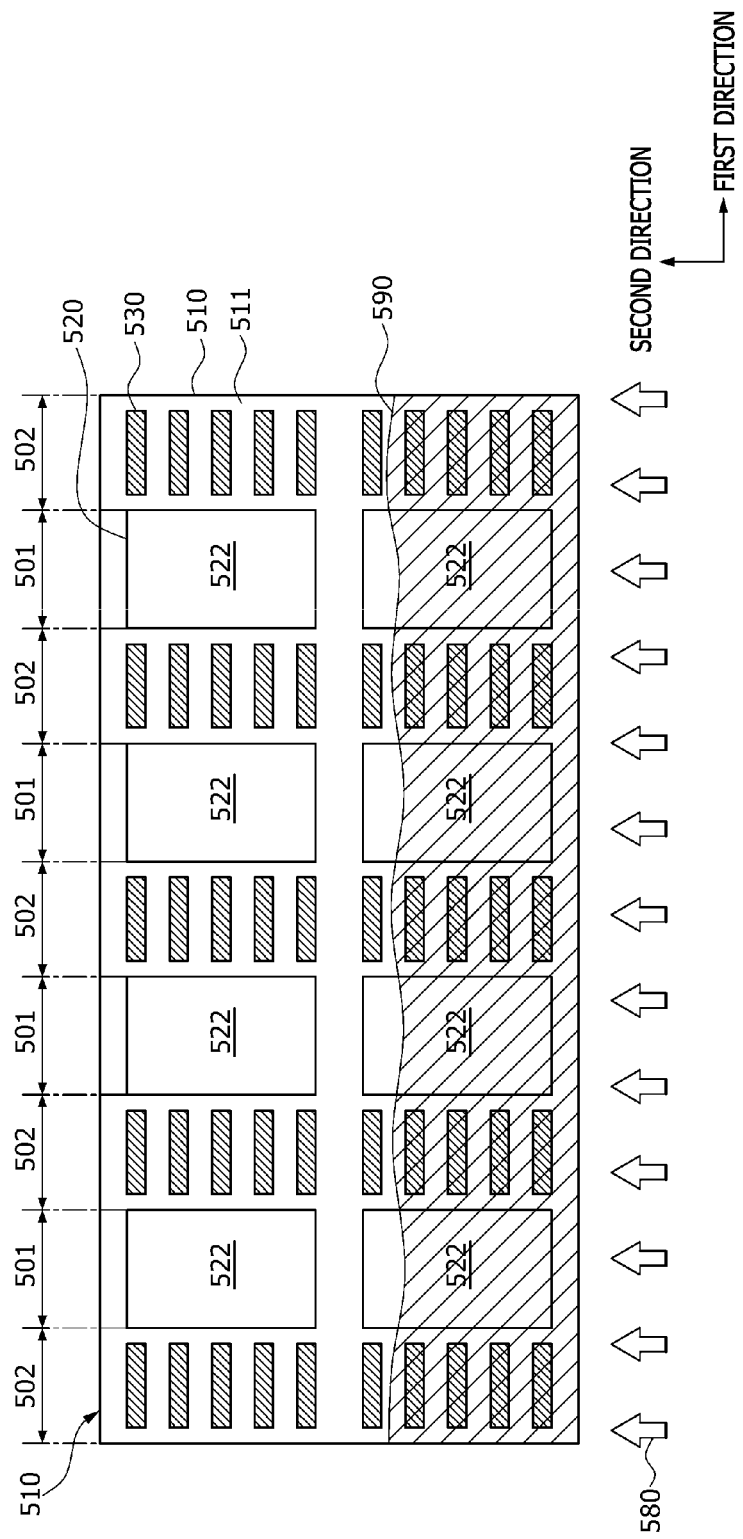

FIG. 11 is a plan view illustrating a process of fabricating a package using a package substrate according to an embodiment of the present disclosure, and FIG. 12 is a cross-sectional view taken along a line III-III' of FIG. 11. FIG. 13 is a plan view illustrating a molding process used in the process of fabricating the package. In FIGS. 11, 12 and 13, the same reference numerals as used in FIG. 7 denote the same elements.

Although the present embodiment is described in conjunction with an example in which a package substrate including a plurality of chip attachment regions is used, embodiments are not limited thereto. That is, the present embodiment may be equally applicable to other examples in which a package substrate including a single chip attachment region is used.

Referring to FIG. 11, a package substrate 500 may be provided. The package substrate 500 may have substantially the same configuration as the package substrate 500 described with reference to FIG. 7. Thus, the detailed description of the package substrate 500 will not be repeated.

As illustrated in FIGS. 11 and 12, a plurality of chips 522, for example, a plurality of semiconductor chips, may be attached to respective ones of the chip attachment regions 520 of the package substrate 500. In an embodiment, the chips 522 may be flip chips that are electrically connected to the package substrate 500 using bumps or solder balls. In another embodiment, the chips 522 may be electrically connected to the package substrate 500 using metal wires.

The package substrate 500 including the chips 522 may then be loaded into a molding apparatus. As illustrated in FIG. 13, in the molding apparatus a molding material 590 may be introduced onto the package substrate 500 including the chips 522 and the patterns 530. As illustrated by arrows 580, the molding material 590 may be injected from a side of the package substrate 500 along the second direction.

A flow speed of the molding material 590 in the first regions 501 including the chips 522 may be similar to a flow speed of the molding material 590 in the second regions 502 including the patterns 530. Thus, the flow speed of the molding material 590 may be substantially uniform throughout the package substrate 500.

The molding process may be performed until the package substrate 500 including the chips 522 and the patterns 530 are fully covered with the molding material 590. Although not shown in the drawings, the package substrate 500 may be separated into a plurality of packages after the molding process.

Figure 14:
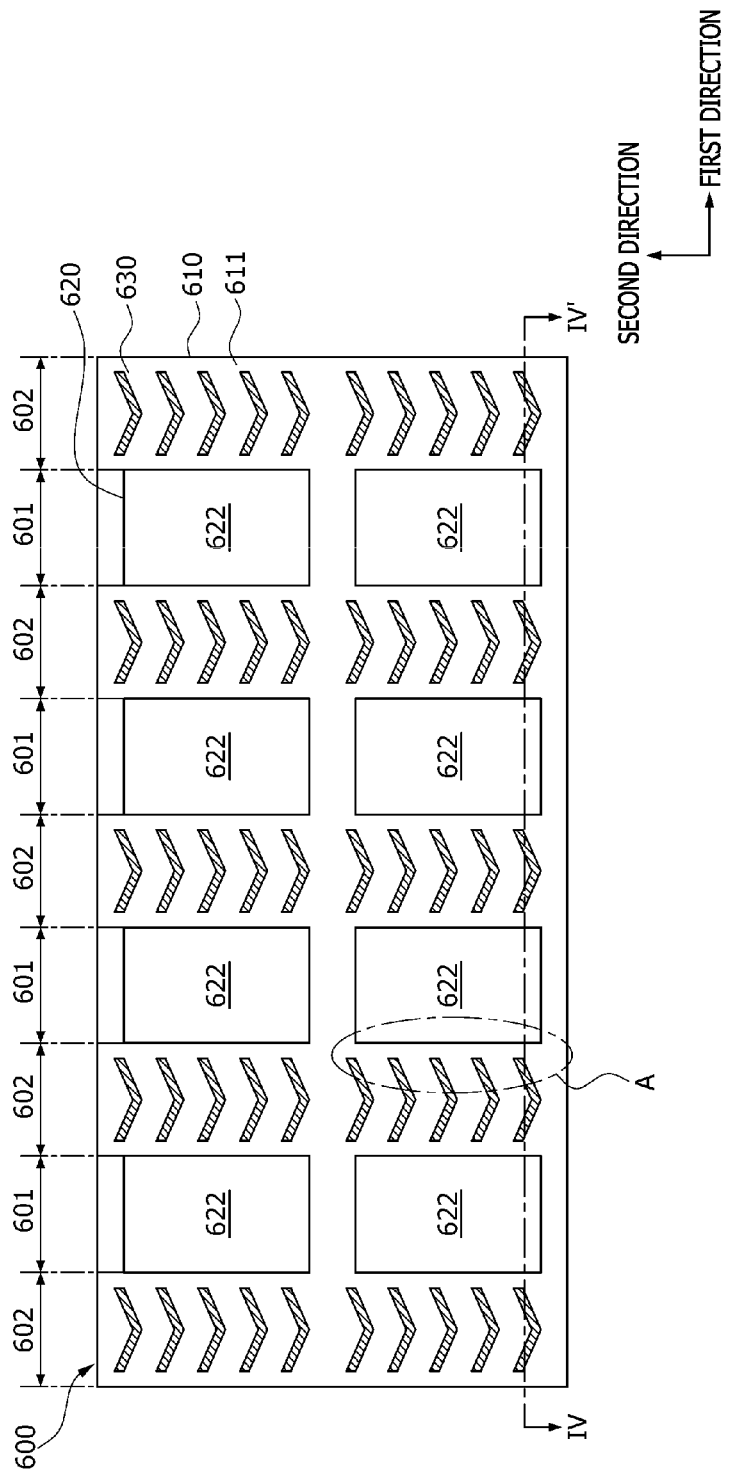
FIGS. 14, 15, and 16 are schematic views illustrating a process of fabricating packages using a package substrate according to another embodiment.
Figure 15:
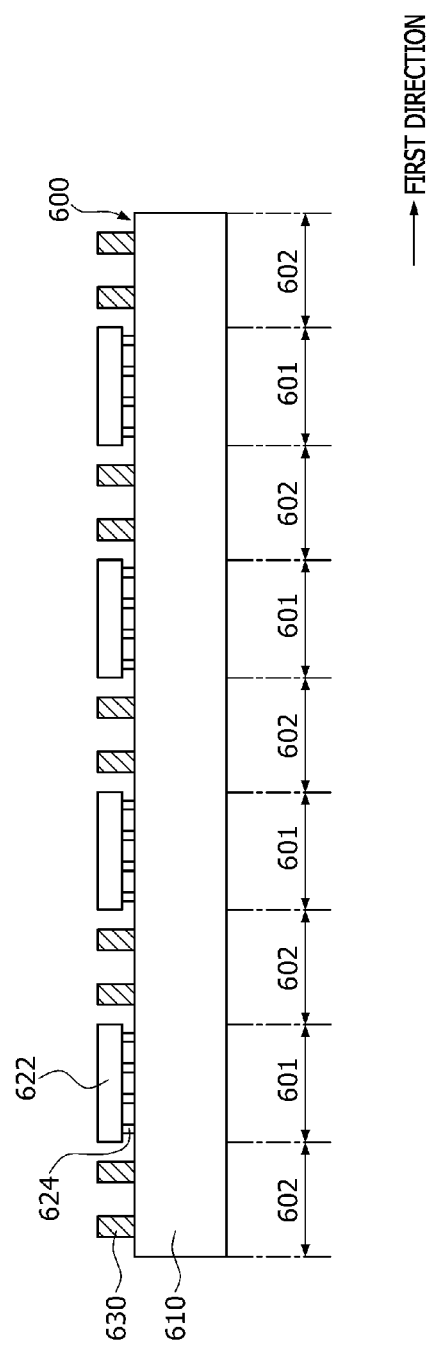
Figure 16:
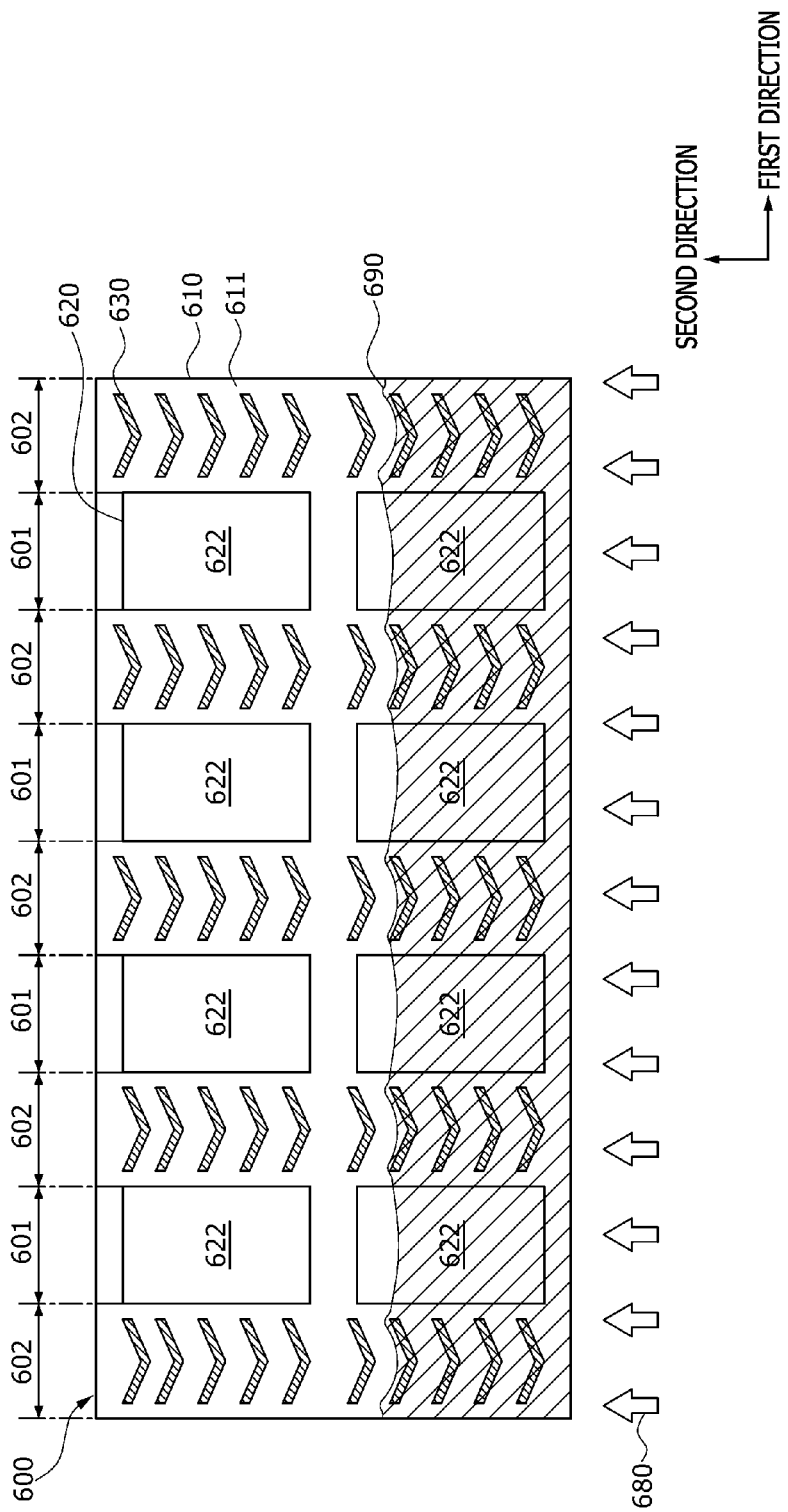

FIG. 14 is a plan view illustrating a process of fabricating a package using a package substrate according to another embodiment, and FIG. 15 is a cross-sectional view taken along a line IV-IV' of FIG. 14. FIG. 16 is a plan view illustrating a molding process used in the process of fabricating the package. In FIGS. 14, 15 and 16, the same reference numerals as used in FIG. 8 denote the same elements.

Although the present embodiment is described in conjunction with an example in which a package substrate including a plurality of chip attachment regions is used, embodiments are not limited thereto. That is, the present embodiment may be equally applicable to other examples in which a package substrate including a single chip attachment region is used.

Referring to FIG. 14, a package substrate 600 may be provided. The package substrate 600 may have substantially the same configuration as the package substrate 600 described with reference to FIG. 8. Thus, the detailed description of the package substrate 600 will not be repeated.

As illustrated in FIGS. 14 and 15, a plurality of chips 622, for example, a plurality of semiconductor chips, may be attached to respective ones of the chip attachment regions 620 of the package substrate 600. The chips 622 may be flip chips. That is, pads (not shown) disposed on a lower surface of each of the chips 622 may be electrically connected to pads (not shown) disposed on a top surface 611 of the substrate body 610 in each of the chip attachment regions 620 through bumps 624. In some embodiments, the bumps 624 may be replaced with other connection members such as solder balls. The package substrate 600 having the chips 622 may then be loaded into a molding apparatus.

As illustrated in FIG. 16, in the molding apparatus a molding material 690 may be introduced onto the package substrate 600 including the chips 622 and the patterns 630. As illustrated by arrows 680, the molding material 690 may be injected from a side of the package substrate 600 along the second direction.

A flow speed of the molding material 690 in the first regions 601 including the chips 622 may be similar to a flow speed of the molding material 690 in the second regions 602 including the patterns 630. Thus, the flow speed of the molding material 690 may be substantially uniform throughout the package substrate 600.

The presence of the "V"-shaped patterns 630 may divert a portion of the molding material 690 introduced into each of the second regions 602 so as to flow towards side regions (such as a region "A" of FIG. 14) of the chips 622. Accordingly, the molding material 690 may be more readily introduced into gaps between the chips 622 and the substrate body 610 so as to sufficiently fill the narrow spaces between the bumps 624 without any voids.

The molding process may be performed until the package substrate 600 including the chips 622 and the patterns 630 are fully covered with the molding material 690. Although not shown in the drawings, the package substrate 600 may be separated into a plurality of packages after the molding process.

Figure 17:
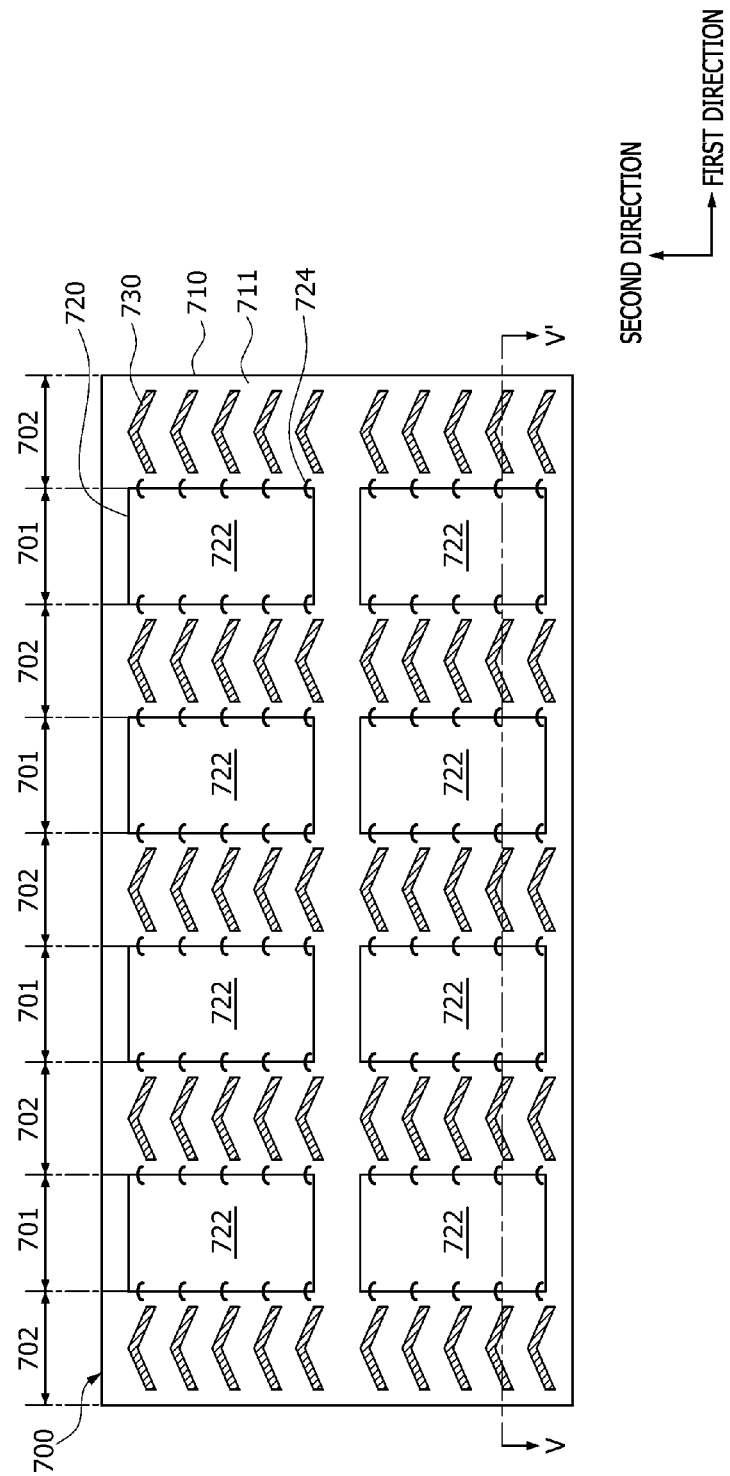
FIGS. 17, 18, and 19 are schematic views illustrating a process of fabricating packages using a package substrate according to another embodiment.
Figure 18:
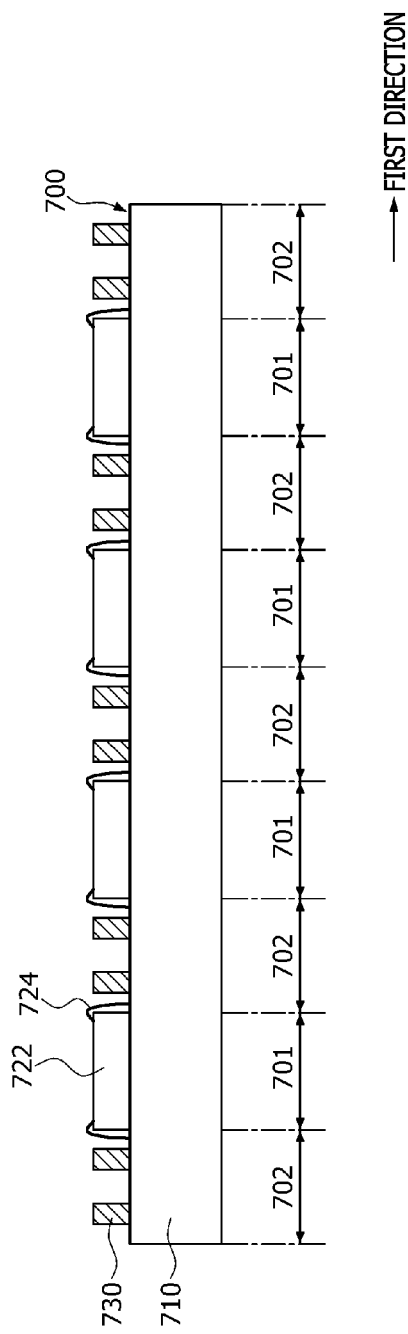
Figure 19:
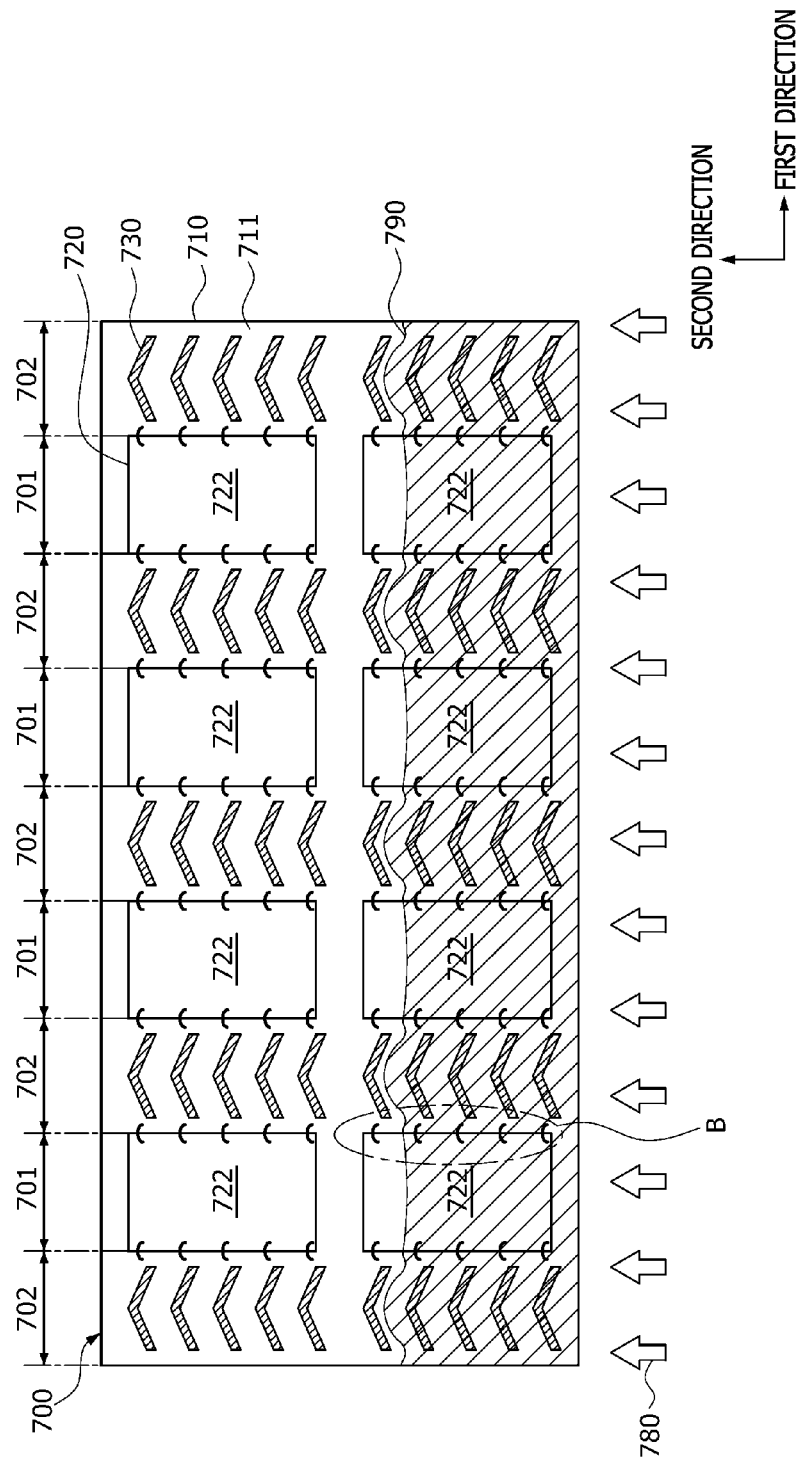

FIG. 17 is a plan view illustrating a process of fabricating a package using a package substrate according to another embodiment, and FIG. 18 is a cross-sectional view taken along a line V-V' of FIG. 17. FIG. 19 is a plan view illustrating a molding process used in the process of fabricating the package. In FIGS. 17, 18 and 19, the same reference numerals as used in FIG. 9 denote the same elements.

Although the present embodiment is described in conjunction with an example in which a package substrate including a plurality of chip attachment regions is used, embodiments are not limited thereto. That is, the present embodiment may be equally applicable to other examples in which a package substrate including a single chip attachment region is used.

Referring to FIG. 17, a package substrate 700 may be provided. The package substrate 700 may have substantially the same configuration as the package substrate 700 described with reference to FIG. 9. Thus, the detailed description of the package substrate 700 will not be repeated.

As illustrated in FIGS. 17 and 18, a plurality of chips 722, for example, a plurality of semiconductor chips, may be attached to respective ones of the chip attachment regions 720 of the package substrate 700. In an embodiment, pads (not shown) disposed on an upper surface of each of the chips 722 may be electrically connected to pads (not shown) disposed on a top surface 711 of the substrate body 710 in each of the chip attachment regions 720 through metal wires 724.

The package substrate 700 having the chips 722 may then be loaded into a molding apparatus. As illustrated in FIG. 19, in the molding apparatus a molding material 790 may be introduced onto the package substrate 700 including the chips 722 and the patterns 730. As illustrated by arrows 780, the molding material 790 may be injected from a side of the package substrate 700 along the second direction.

A flow speed of the molding material 790 in the first regions 701 including the chips 722 may be similar to a flow speed of the molding material 790 in the second regions 702 including the patterns 730. Thus, the flow speed of the molding material 790 may be substantially uniform throughout the package substrate 700.

The "reversed V"-shaped patterns 730 may reduce the flow speed of the molding material 790 introduced in regions "B" between the chips 722 and the patterns 730. That is, because of the presence of the "reversed V"-shaped patterns 730, the flow speed of the molding material 790 in the regions "B" may be less than the flow speed of the molding material 790 in central regions of the second regions 702. Thus, the "reversed V"-shaped patterns 730 may prevent the metal wires 724 from being damaged or warped during the molding process.

The molding process may be performed until the package substrate 700 including the chips 722 and the patterns 730 are fully covered with the molding material 790. Although not shown in the drawings, the package substrate 700 may be separated into a plurality of packages after the molding process.

As described above, in an embodiment wherein the chips 722 are electrically connected to the package substrate 700 through the metal wires 724, the "reversed V"-shaped patterns 730 of the package substrate 700 may prevent the metal wires 724 from being damaged or warped during the molding process. This effect may also be obtained when packages include the package substrate 800 described with reference to FIG. 10. In such an embodiment, the process described with reference to FIGS. 17, 18 and 19 may be equally applicable to the package substrate 800.

Figure 20:
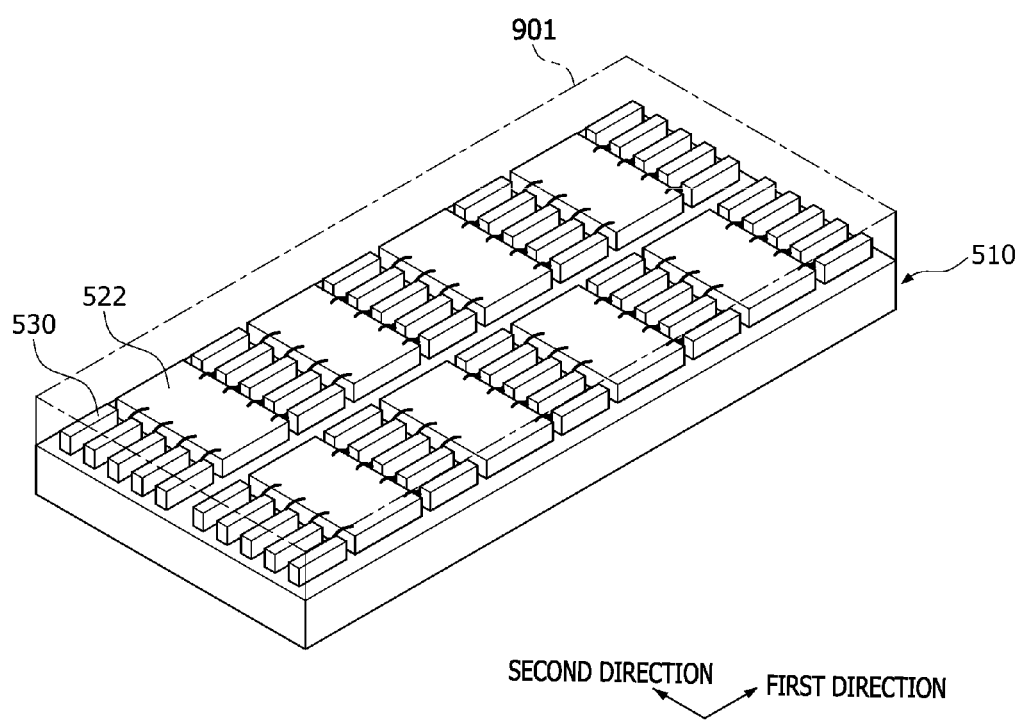
FIG. 20 is a perspective view illustrating a package module including a plurality of packages according to an embodiment.

Referring to FIG. 20, a package module 1001 including a plurality of packages according to some embodiments may include the package substrate 500 described with reference to FIG. 7 and a plurality of separate chips 522 disposed on a top surface of the substrate body 510 included in the package substrate 500. Although FIG. 20 illustrates an example in which the plurality of chips 522 are two-dimensionally arrayed, embodiments are not limited thereto. For example, in some embodiments, the plurality of chips 522 may be three-dimensionally mounted on the substrate body 510.

In an embodiment, each of the chips 522 may be electrically connected to the package substrate 500 through wires. However, embodiments are not limited thereto. In another embodiment, each of the chips 522 may be electrically connected to the package substrate 500 through bumps or solder balls.

Patterns 530 may be disposed between the chips 522. Each of the patterns 530 may have a stripe shape extending in a first direction, as described with reference to FIG. 7. The patterns 530 may be disposed to be spaced apart from each other in a second direction which is substantially perpendicular to the first direction. A height of the patterns 530 may be substantially equal to or less than a thickness of the chips 522.

A molding layer 901 may be disposed on the substrate body 510 to cover the chips 522 and the patterns 530. The molding layer 901 may be formed using the molding process described with reference to FIG. 13.

Figure 21:
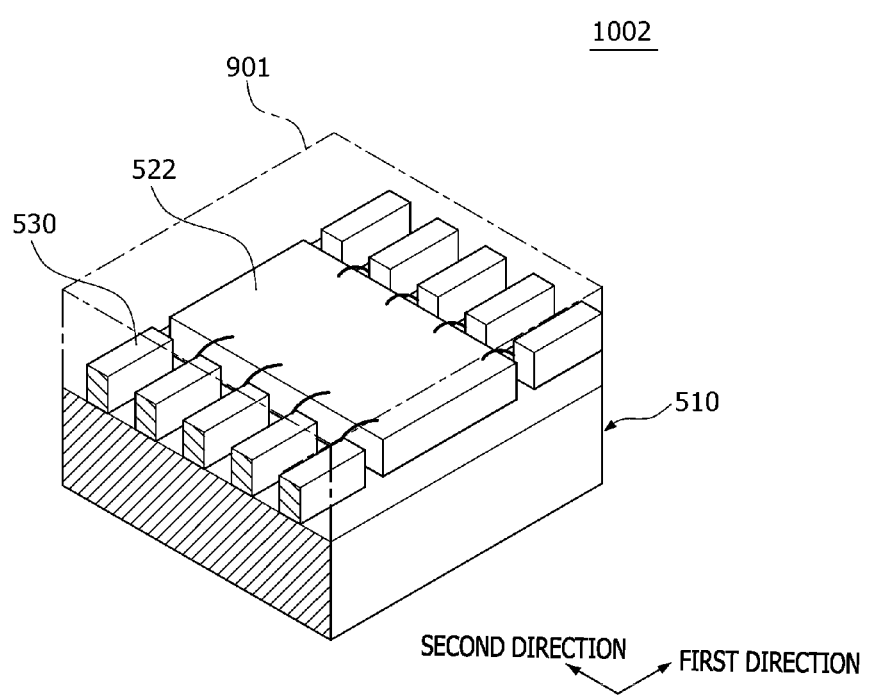
FIG. 21 is a perspective view illustrating one of the plurality of packages included in the package module of FIG. 20.

Referring to FIG. 21, a package 1002 according to an embodiment may be obtained by cutting the package module 1001 of FIG. 20. The package may be configured to include the chip 522 attached to the substrate body 510, portions of the patterns 530 disposed at both sides of the chip 522, and the molding layer 901 disposed on the substrate body 510 to cover the chip 522 and the patterns 530.

Figure 22:
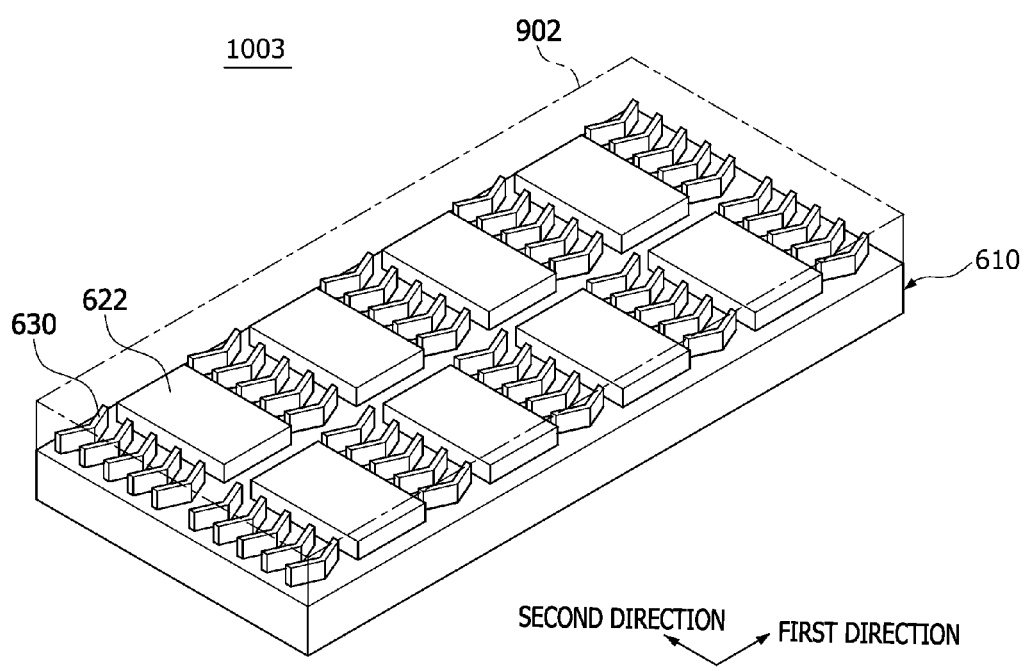
FIG. 22 is a perspective view illustrating a package module including a plurality of packages according to another embodiment.

Referring to FIG. 22, a package module 1003 including a plurality of packages according to an embodiment may include the package substrate 600 described with reference to FIG. 8 and a plurality of separate chips 622 disposed on a top surface of the substrate body 610 included in the package substrate 600. Although FIG. 22 illustrates an example in which the plurality of chips 622 are two-dimensionally arrayed, embodiments are not limited thereto. For example, in some embodiments, the plurality of chips 622 may be three-dimensionally mounted on the substrate body 610.

Although not shown in FIG. 22, each of the chips 622 may be electrically connected to the package substrate 600 through bumps or solder balls. Patterns 630 may be disposed between the chips 622. Each of the patterns 630 may have a "V"-shaped configuration that inclines toward the second direction as it becomes closer to the chips 622 located at both sides thereof, as described with reference to FIG. 8.

The patterns 630 may be disposed to be spaced apart from each other by a predetermined distance in the second direction. The patterns 630 may have a height (i.e., a thickness in a direction perpendicular to both the first and second directions) which is equal to or less than a thickness of the chips 622.

A molding layer 902 may be disposed on the substrate body 610 to cover the chips 622 and the patterns 630. The molding layer 902 may be formed using the molding process described with reference to FIG. 16.

Figure 23:
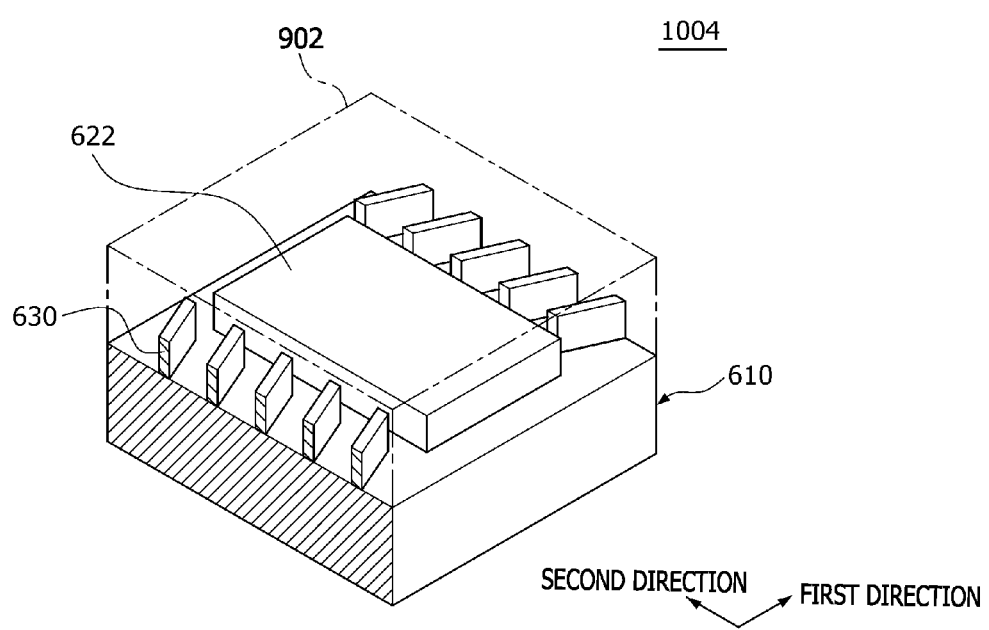
FIG. 23 is a perspective view illustrating one of the plurality of packages included in the package module of FIG. 22.

Referring to FIG. 23, a package 1004 according to an embodiment may be obtained by cutting the package module 1003 of FIG. 22. The package may be configured to include the chip 622 attached to the substrate body 610, portions of the patterns 630 disposed at both sides of the chip 622, and the molding layer 902 disposed on the substrate body 610 to cover the chip 622 and the patterns 630. In the package of FIG. 23, each of the patterns 630 may have a stripe shape which is non-parallel with both the first and second directions and may incline toward the second direction as it becomes closer to the chip 620. The patterns 630 in each side of the chip 622 may be disposed to be spaced apart from each other in the second direction.

Figure 24:
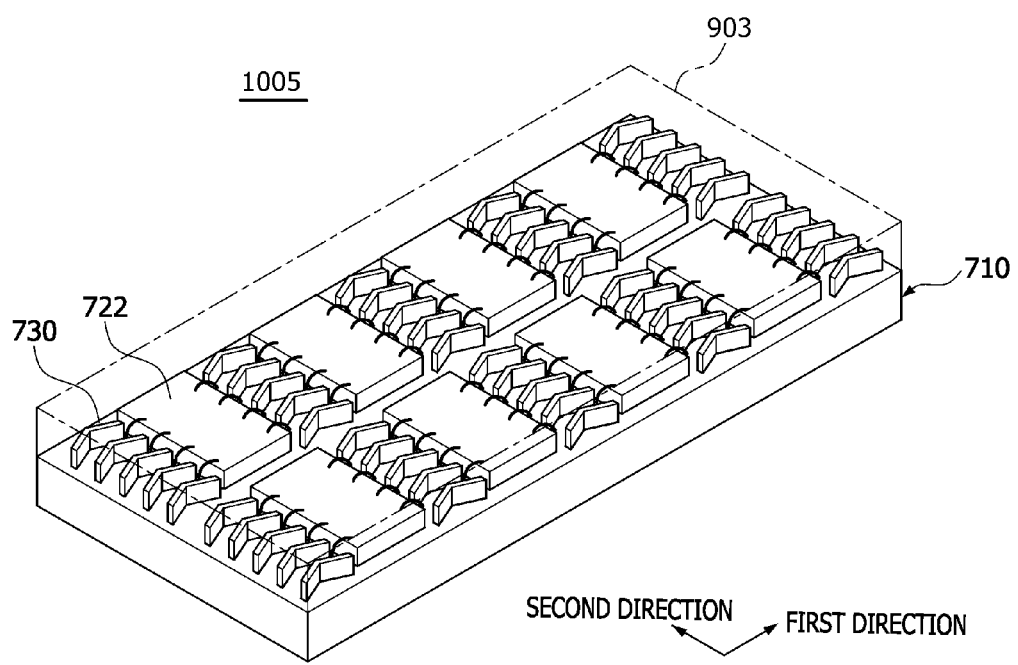
FIG. 24 is a perspective view illustrating a package module including a plurality of packages according to another embodiment.

Referring to FIG. 24, a package module 1005 including a plurality of packages according to an embodiment may include the package substrate 700 described with reference to FIG. 9 and a plurality of separate chips 722 disposed on a top surface of the substrate body 710 included in the package substrate 700. Although FIG. 24 illustrates an example in which the plurality of chips 722 are two-dimensionally arrayed, embodiments are not limited thereto. For example, in some embodiments, the plurality of chips 722 may be three-dimensionally mounted on the substrate body 710.

Each of the chips 722 may be electrically connected to the package substrate 700 through wires. Patterns 730 may be disposed between the chips 722. Each of the patterns 730 may have a "reversed V"-shaped configuration that inclines toward an antiparallel direction of the second direction as it becomes closer to the chip 722, as described with reference to FIG. 9. The patterns 730 may be disposed to be spaced apart from each other by a predetermined distance in the second direction. The patterns 730 may have a height (i.e., a thickness in a direction perpendicular to both the first and second directions) which is equal to or less than a thickness of the chips 722.

A molding layer 903 may be disposed on the substrate body 710 to cover the chips 722 and the patterns 730. The molding layer 903 may be formed using the molding process described with reference to FIG. 19.

Figure 25:
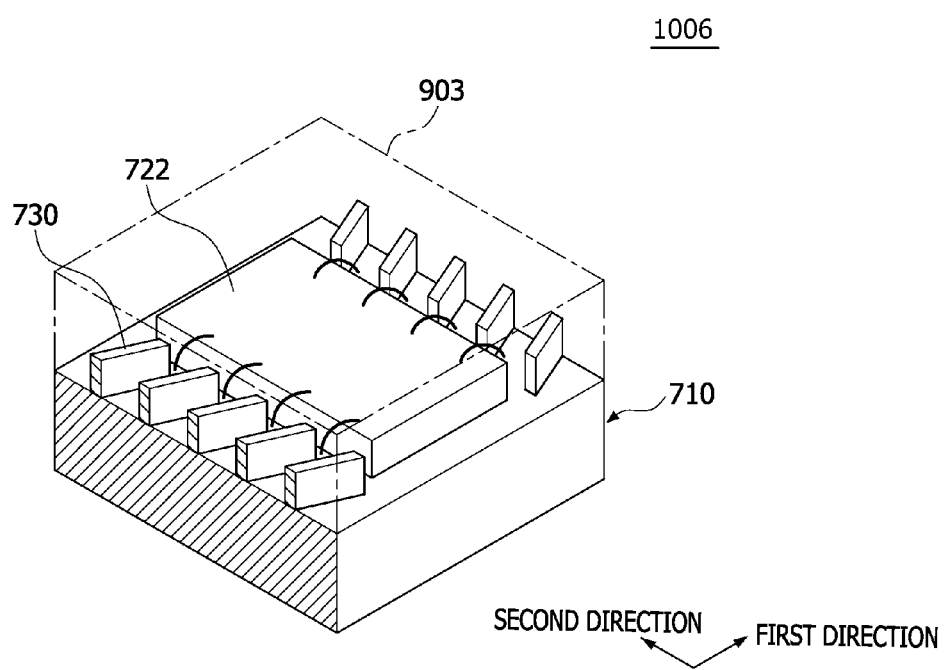
FIG. 25 is a perspective view illustrating one of the plurality of packages included in the package module of FIG. 24.

Referring to FIG. 25, a package 1006 according to an embodiment may be obtained by cutting the package module 1005 of FIG. 24. The package may be configured to include the chip 722 attached to the substrate body 710, portions of the patterns 730 disposed at both sides of the chip 722, and the molding layer 903 disposed on the substrate body 710 to cover the chip 722 and the patterns 730.

Figure 26:
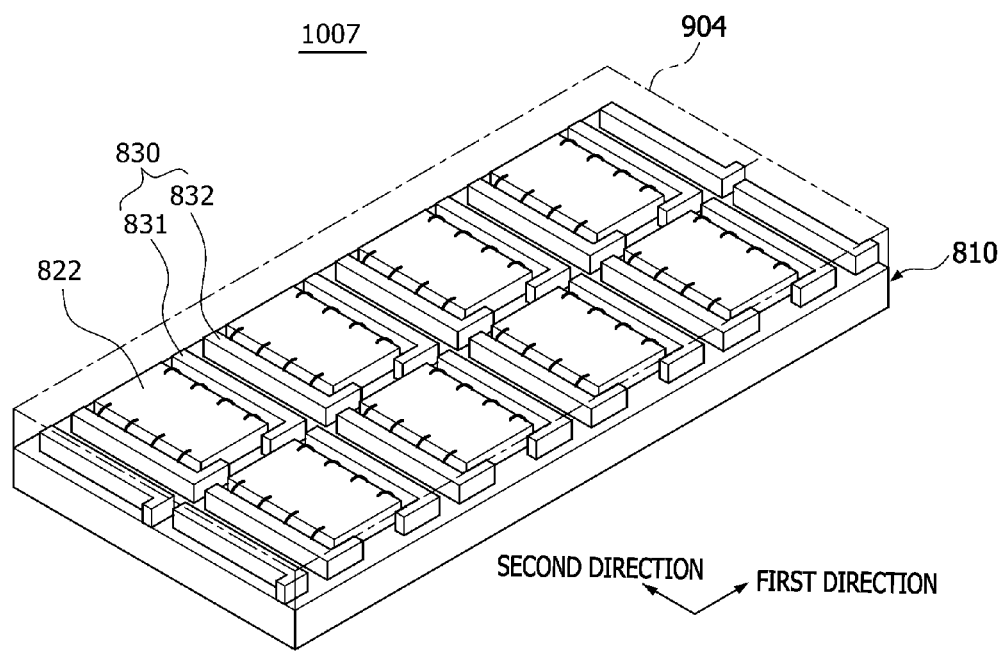
FIG. 26 is a perspective view illustrating a package module including a plurality of packages according to another embodiment.

Referring to FIG. 26, a package module 1007 including a plurality of packages according to an embodiment may include the package substrate 800 described with reference to FIG. 10 and a plurality of separate chips 822 disposed on a top surface of the substrate body 810 included in the package substrate 800. Although FIG. 26 illustrates an example in which the plurality of chips 822 are two-dimensionally arrayed, embodiments are not limited thereto. For example, in some embodiments, the plurality of chips 822 may be three-dimensionally mounted on the substrate body 810.

Each of the chips 822 may be electrically connected to the package substrate 800 through wires. Patterns 830 may be disposed between the chips 822. Each of the patterns 830 may include a left pattern 831 and a right pattern 832, as described with reference to FIG. 10.

The left pattern 831 may be disposed to be adjacent to a right edge of the chip 822. The left pattern 831 may include a first pattern portion extending in the second direction to have a stripe shape and a second pattern portion extending from an end of the first pattern portion adjacent to an inlet of the molding material along an antiparallel direction of the first direction. The right pattern 832 may be disposed to be adjacent to a left edge of the chip 822. The right pattern 832 may include a first pattern portion extending in the second direction to have a stripe shape and a second pattern portion extending from an end of the first pattern portion adjacent to an inlet of the molding material along the first direction.

A height (i.e., a thickness in a direction perpendicular to both the first and second directions) of the patterns 830 may be equal to or less than a thickness of the chips 822. A molding layer 904 may be disposed on the substrate body 810 to cover the chips 822 and the patterns 830.

Figure 27:
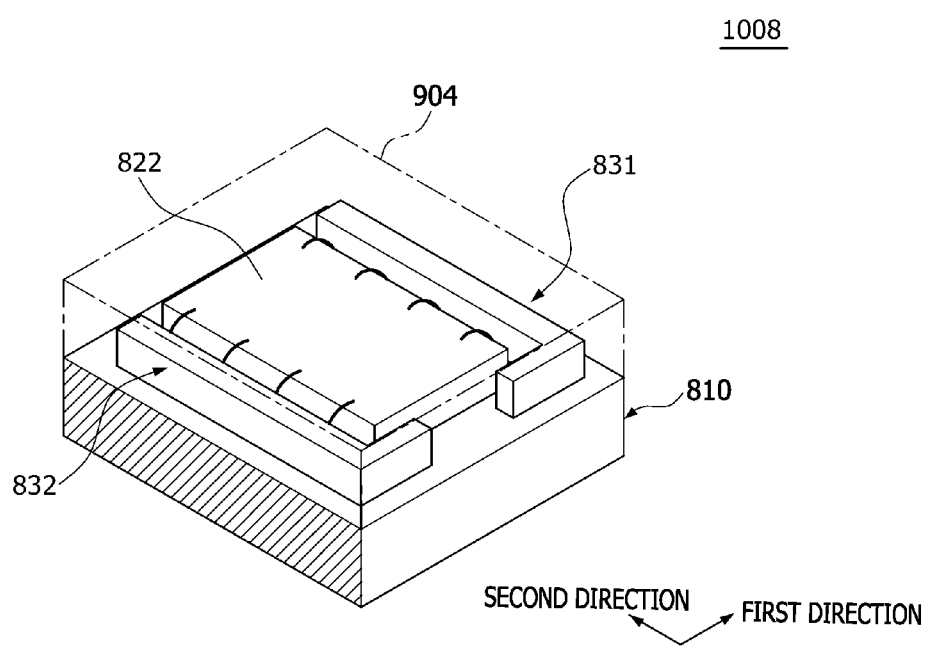
FIG. 27 is a perspective view illustrating one of the plurality of packages included in the package module of FIG. 26.

Referring to FIG. 27, a package 1008 according to an embodiment may be obtained by cutting the package module 1007 of FIG. 26. The package may be configured to include the chip 822 attached to the substrate body 810, the left and right patterns 831 and 832 disposed at both sides of the chip 822, and the molding layer 904 disposed on the substrate body 810 to cover the chip 822 and the left and right patterns 831 and 832.

The packages described above may be applied to various electronic systems.

Figure 28:
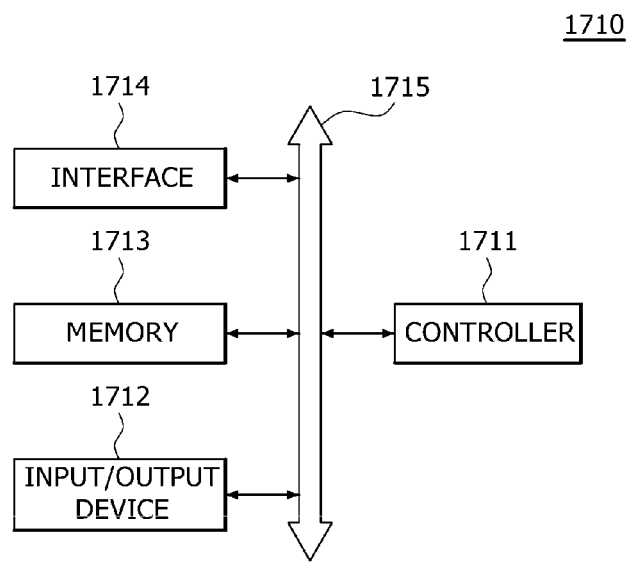
FIG. 28 is a block diagram illustrating an electronic system including a package according to an embodiment.

Referring to FIG. 28, the package in accordance with an embodiment may be applied to an electronic system 1710. The electronic system 1710 may include a controller 1711, an input/output unit 1712, and a memory 1713. The controller 1711, the input/output unit 1712, and the memory 1713 may be coupled with one another through a bus 1715 providing a path through which data are transmitted.

For example, the controller 1711 may include at least any one of at least one microprocessor, at least one digital signal processor, at least one microcontroller, and logic devices capable of performing the same functions as these components. At least one of the controller 1711 and the memory 1713 may include at least any one of the packages according to the embodiments of the present disclosure. The input/ output unit 1712 may include at least one selected among a keypad, a keyboard, a display device, a touch screen and so forth. The memory 1713 is a device for storing data. The memory 1713 may store data and/or commands to be executed by the controller 1711, and the like.

The memory 1713 may include a volatile memory device such as a DRAM and/or a nonvolatile memory device such as a flash memory. For example, a flash memory may be mounted to an information processing system such as a mobile terminal or a desk top computer. The flash memory may constitute a solid state disk (SSD). In this case, the electronic system 1710 may stably store a large amount of data in a flash memory system.

The electronic system 1710 may further include an interface 1714 suitable for transmitting and receiving data to and from a communication network. The interface 1714 may be a wired or wireless type. For example, the interface 1714 may include an antenna or a wired or wireless transceiver.

The electronic system 1710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

In an embodiment wherein the electronic system 1710 is an equipment capable of performing wireless communication, the electronic system 1710 may be used in a communication system such as a system employing one or more of CDMA (code division multiple access), GSM (global system for mobile communications), NADC (North American digital cellular), E-TDMA (enhanced-time division multiple access), WCDMA (wideband code division multiple access), CDMA2000, LTE (long term evolution), and Wibro (wireless broadband Internet).

Figure 29:
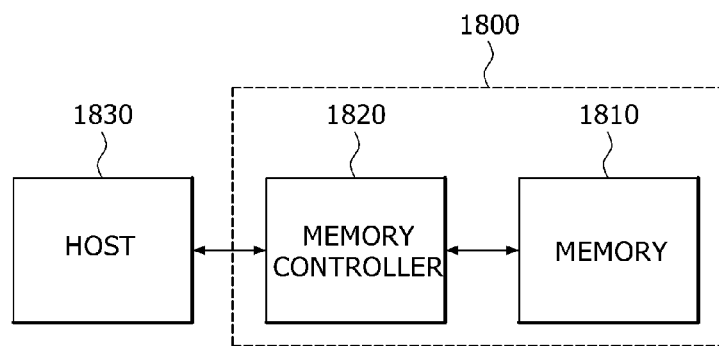
FIG. 29 is a block diagram illustrating another electronic system including a package according to an embodiment.

Referring to FIG. 29, the package in accordance with the embodiments may be provided in the form of a memory card 1800. For example, the memory card 1800 may include a memory 1810 such as a nonvolatile memory device and a memory controller 1820. The memory 1810 and the memory controller 1820 may store data or read stored data.

The memory 1810 may include at least any one among nonvolatile memory devices to which the packaging technologies of the embodiments of the present disclosure are applied. The memory controller 1820 may control the memory 1810 such that stored data is read out or data is stored in response to a read/write request from a host 1830.

The embodiments have been disclosed above for illustrative purposes. Those skilled in the art will appreciate that various modifications, additions, and substitutions are possible, without departing from the scope and spirit of the present disclosure as including the accompanying claims.

What is claimed is:

1. A package substrate comprising:
    a substrate body having a first region including a chip attachment region and a second region adjacent to the first region; and
    a plurality of patterns disposed on the substrate body in the second region, each of the plurality of patterns extending in a first direction and having a stripe shape, and the plurality of patterns being spaced apart from each other in a second direction which is substantially perpendicular to the first direction,
    wherein the plurality of patterns includes a solder resist material.

2. The package substrate of claim 1, wherein the first direction is substantially perpendicular to a side of the first region adjacent to the second region.

3. The package substrate of claim 2, wherein the patterns are spaced apart from the first region by a predetermined distance in the first direction.

4. The package substrate of claim 2, wherein the patterns have a height which is substantially equal to or less than a thickness of a chip attached to the chip attachment region.

5. The package substrate of claim 2, wherein the package substrate is included in a package, the package further comprising:
    a chip disposed on the chip attachment region of the package substrate, wherein a sidewall of the chip is substantially perpendicular to the first direction; and
    a molding layer disposed on the package substrate to cover the chip and the patterns.

6. The package substrate of claim 1, wherein the first direction is substantially non-perpendicular to an edge of the first region adjacent to the second region.

7. The package substrate of claim 6, wherein the patterns are spaced apart from the first region by a predetermined distance in the first direction.

8. The package substrate of claim 6, wherein the patterns have a height which is substantially equal to or less than a thickness of a chip attached to the chip attachment region.

9. The package substrate of claim 6, wherein the package substrate is included in a package, the package further comprising:
    a chip disposed on the chip attachment region of the package substrate wherein a sidewall of the chip is parallel to the edge of the first region; and
    a molding layer disposed on the package substrate to cover the chip and the patterns.

* * * * *